US010042196B2

(12) United States Patent
Iwasaka et al.

(10) Patent No.: US 10,042,196 B2
(45) Date of Patent: Aug. 7, 2018

(54) DISPLAY AND METHOD FOR MANUFACTURING DISPLAY

(71) Applicant: Mitsubishi Electric Corporation, Tokyo (JP)

(72) Inventors: Toshihiko Iwasaka, Kumamoto (JP); Masaru Aoki, Kumamoto (JP); Kazunori Inoue, Kumamoto (JP); Yusuke Yamagata, Kumamoto (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/554,320

(22) PCT Filed: Jun. 21, 2016

(86) PCT No.: PCT/JP2016/068314
§ 371 (c)(1),
(2) Date: Aug. 29, 2017

(87) PCT Pub. No.: WO2017/002655
PCT Pub. Date: Jan. 5, 2017

(65) Prior Publication Data
US 2018/0052356 A1    Feb. 22, 2018

(30) Foreign Application Priority Data
Jul. 1, 2015  (JP) .................. 2015-132397

(51) Int. Cl.
G02F 1/1343    (2006.01)
G02F 1/1333    (2006.01)
(Continued)

(52) U.S. Cl.
CPC .... G02F 1/133345 (2013.01); G02F 1/13439 (2013.01); G02F 1/133514 (2013.01);
(Continued)

(58) Field of Classification Search
CPC ............. G02F 1/1343; G02F 1/134309; G02F 2001/134318; G02F 1/133514; G02F 1/133345
See application file for complete search history.

(56) References Cited

U.S. PATENT DOCUMENTS 7,804,091 B2    9/2010 Takechi et al.
7,868,954 B2 *  1/2011 Chen .................. G02F 1/13394
                                                       349/38
(Continued)

FOREIGN PATENT DOCUMENTS

JP   H08-095075 A    4/1996
JP   2006-285105 A   10/2006
(Continued)

OTHER PUBLICATIONS

International Search Report issued in PCT/JP2016/068314; dated Sep. 13, 2016.

Primary Examiner — Jia Pan
(74) Attorney, Agent, or Firm — Studebaker & Brackett PC

(57) ABSTRACT

The insulating properties of terminal lines on an array substrate can be maintained without adding any steps for avoiding formation of a counter electrode on the peripheral portion of a color filter substrate. A display includes an insulation film formed to cover an electrode formed on a surface of an array substrate, an oxide semiconductor film formed on a surface of a color filter substrate, and a seal member that is located between the insulation film and the oxide semiconductor film, which face each other, and that bonds the insulation film and the oxide semiconductor film together. An area surrounded by the seal member in plan view is taken as a display area. A portion of the oxide semiconductor film that corresponds to the display area is a conductor, and a portion of the oxide semiconductor film that corresponds to the outside of the display area is an insulator.

13 Claims, 13 Drawing Sheets

(51) Int. Cl.
  *G02F 1/1335*   (2006.01)
  *H01J 37/32*   (2006.01)
(52) U.S. Cl.
  CPC .... *G02F 1/134309* (2013.01); *G02F 2201/50* (2013.01); *G02F 2202/10* (2013.01); *H01J 37/32431* (2013.01)

(56) References Cited

U.S. PATENT DOCUMENTS

| | | |
|---|---|---|
| 8,420,441 B2 | 4/2013 | Yamazaki et al. |
| 2006/0221296 A1* | 10/2006 | Fujita ................ G02F 1/133351 349/187 |
| 2007/0096124 A1 | 5/2007 | Shin et al. |
| 2008/0006834 A1* | 1/2008 | Fujita ................ G02F 1/133351 257/83 |
| 2011/0037068 A1* | 2/2011 | Yamazaki ........... H01L 27/1225 257/43 |

FOREIGN PATENT DOCUMENTS

| | | |
|---|---|---|
| JP | 2007-108737 A | 4/2007 |
| JP | 2008-003337 A | 1/2008 |
| JP | 2008-040343 A | 2/2008 |
| JP | 2008-304507 A | 12/2008 |
| JP | 2011-049549 A | 3/2011 |
| JP | 2011-187509 A | 9/2011 |

\* cited by examiner

DISPLAY AND METHOD FOR MANUFACTURING DISPLAY

TECHNICAL FIELD

The present technique relates to a display and a method for manufacturing a display.

BACKGROUND ART

In general, liquid crystal panels for liquid crystal displays, which are one example of displays, are provided with a TFT array substrate that includes thin-film transistors (i.e., TFTs) or pixel electrodes connected to TFTs. A display area is formed by arranging such TFTs and pixel electrodes in a matrix. The TFT array substrate includes scanning signal lines connected to the TFTs, and display signal lines connected to the TFTs.

Such a TFT array substrate has a single element section that includes a plurality of scanning signal lines and display signal lines. Terminals for inputting signals to the scanning signal lines and the display signal lines are provided at the edge of the element section of the TFT array substrate.

A color filter (i.e., CF) substrate is further disposed as a counter substrate to the TFT array substrate. The color filter substrate includes, for example, a counter electrode and a resin film.

The TFT array substrate and the color filter substrate are bonded together with a seal member. Here, the seal member is formed in a frame shape to surround the display area. A liquid crystal is further sealed in the area formed by the TFT array substrate, the color filter substrate, and the seal member. Then, devices such as a driving IC and a flexible printed circuit board (i.e., FPC) are mounted, and furthermore devices such as a backlight unit are mounted, whereby a liquid crystal display module is completed.

When there is a foreign substance in an area on the outside of and adjacent to the space in which the liquid crystal is sealed, an insulation film that is formed to cover terminal lines may be damaged by the foreign substance. If this is the case, flaws in the insulation film may reach and expose the terminal lines. This deteriorates the insulating properties of the terminal lines.

If, in this situation, moisture or the like adhering to the counter electrode on the color filter substrate enters the flaws in the insulation film, a conductive circuit may be formed between the counter electrode on the color filter substrate and the terminal lines on the TFT array substrate. In this case, problems such as disconnection due to electrolytic corrosion may occur.

The cause of the formation of the conductive circuit between the counter electrode and the terminal lines may be the entry of a metallic foreign substance (i.e., conductor foreign substance), instead of moisture, from the flaws in the insulation film.

To address this problem, structures are disclosed in which the terminal lines on the TFT array substrate are covered with a protective film or the like (see, for example, Patent Document 1). Other structures are also disclosed in which a hydrophobic film or a resin film is formed on the counter electrode of the color filter substrate (see, for example, Patent Documents 2 and 3).

PRIOR ART DOCUMENTS

Patent Documents

Patent Document 1: Japanese Patent Application Laid-Open No. 8-95075

Patent Document 2: Japanese Patent Application Laid-Open No. 2006-285105

Patent Document 3: Japanese Patent Application Laid-Open No. 2008-3337

SUMMARY

Problems to be Solved by the Invention

Even if the protective films are formed on the counter electrode of the color filter substrate and on the insulation film of the TFT array substrate, ultimately a foreign substance or other substance may cause damage to the protective films, causing the terminal lines or the counter electrode to be exposed. In this case, the insulating properties of the terminal lines are deteriorated as well.

If, in this situation, moisture or the like adhering to the counter electrode on the color filter substrate enters flaws in the insulation film, a conductive circuit may be formed between the counter electrode on the color filter substrate and the terminal lines on the TFT array substrate. In this case, problems such as disconnection due to electrolytic corrosion may occur.

The color filter substrate can also be formed using a method in which a mask is previously formed on the peripheral portion of the color filter substrate so that the counter electrode made of a transparent conductive film such as tin-doped indium oxide or indium tin oxide (i.e., ITO) is not deposited on the peripheral portion of the color filter substrate. This method, however, requires an additional step for avoiding formation of the counter electrode on the peripheral portion of the color filter substrate.

Another example of the method for avoiding formation of the counter electrode on the peripheral portion of the color filter substrate is a method in which, after a transparent conductive film such as ITO is deposited on the entire surface of the color filter substrate, a resist is formed by photolithography on the portion other than the peripheral portion of the color filter substrate; the transparent conductive film on the peripheral portion of the color filter substrate is removed using an etching system; and finally the resist is removed. This method, however, also requires an additional step for avoiding formation of the counter electrode on the peripheral portion of the color filter substrate.

The present technique is for solving the problem as described above, and relates to a display that is capable of maintaining the insulating properties of the terminal lines on the array substrate without adding any steps for avoiding formation of the counter electrode on the peripheral portion of the color filter substrate, and to a method for manufacturing such a display.

Means to Solve the Problems

A display according to an aspect of the present technique includes a first substrate, an electrode formed on a surface of the first substrate, an insulation film formed to cover the electrode, a second substrate, an oxide semiconductor film formed on a surface of the second substrate, and a seal member that is located between the insulation film and the oxide semiconductor film facing each other and that bonds the insulation film and the oxide semiconductor film together. An area that is sandwiched between the first substrate and the second substrate and surrounded by the seal member in plan view is taken as a display area. A portion of the oxide semiconductor film that corresponds to the display area is a conductor, and a portion of the oxide semiconductor film that corresponds to an outside of the display area is an insulator.

A method for manufacturing a display according to an aspect of the present technique includes forming an electrode on a surface of a first substrate, forming an insulation film that covers the electrode, forming an oxide semiconductor film on a surface of a second substrate, and bonding the insulation film and the oxide semiconductor film with a seal member, the insulation film and the oxide semiconductor film facing each other. An area that is sandwiched between the first substrate and the second substrate and surrounded by the seal member in plan view is taken as a display area. A portion of the oxide semiconductor film that corresponds to the display area is a conductor, and a portion of the oxide semiconductor film that corresponds to an outside of the display area is an insulator.

Effects of the Invention

A display according to an aspect of the present technique includes a first substrate, an electrode formed on a surface of the first substrate, an insulation film formed to cover the electrode, a second substrate, an oxide semiconductor film formed on a surface of the second substrate, and a seal member that is located between the insulation film and the oxide semiconductor film facing each other and that bonds the insulation film and the oxide semiconductor film together. An area that is sandwiched between the first substrate and the second substrate and surrounded by the seal member in plan view is taken as a display area. A portion of the oxide semiconductor film that corresponds to the display area is a conductor, and a portion of the oxide semiconductor film that corresponds to an outside of the display area is an insulator.

With this configuration, the insulating properties of the electrodes on the first substrate can be maintained without adding any steps for avoiding formation of the counter electrode on the peripheral portion of the second substrate.

A method for manufacturing a display according to an aspect of the present technique includes forming an electrode on a surface of a first substrate, forming an insulation film that covers the electrode, forming an oxide semiconductor film on a surface of a second substrate, and bonding the insulation film and the oxide semiconductor film with a seal member, the insulation film and the oxide semiconductor film facing each other. An area that is sandwiched between the first substrate and the second substrate and surrounded by the seal member in plan view is taken as a display area. A portion of the oxide semiconductor film that corresponds to the display area is a conductor, and a portion of the oxide semiconductor film that corresponds to an outside of the display area is an insulator.

With this configuration, the insulating properties of the electrodes on the first substrate can be maintained without adding any steps for avoiding formation of the counter electrode on the peripheral portion of the second substrate.

These and other objects, features, aspects and advantages of the present invention will become more apparent from the following detailed description of the present invention when taken in conjunction with the accompanying drawings.

DESCRIPTION OF EMBODIMENTS

Figure 1:
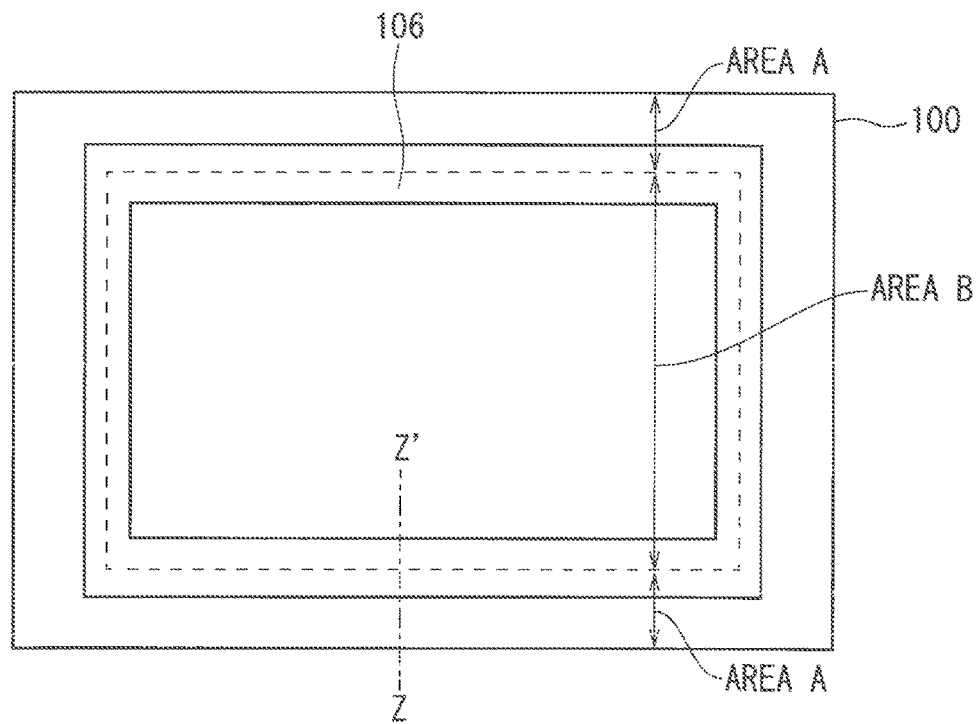
FIG. 1 is a plan view illustrating a structure of a color filter substrate according to an embodiment.

Embodiments will now be described hereinafter with reference to the accompanying drawings. The drawings are drawn in schematic form, and mutual relationships between sizes and positions of images illustrated in different drawings do not always reflect actual relationships and may be appropriately changed. In the following description, similar constituent elements are given the same reference numeral, and they are assumed to have the same name and the same function. Thus, detailed description thereof may be omitted in some cases.

In the following description, terms such as "upper," "lower," "side," "bottom," "front," and "rear" that may be used to indicate specific positions and directions are merely used for convenience's sake in order to facilitate understanding of the content of embodiments, and do not relate to directions at the time of actual implementation.

First Embodiment

A liquid crystal display will now be described hereinafter as one example of a display according to an embodiment of the present invention.

FIG. 1 is a plan view illustrating a structure of a color filter substrate according to the present embodiment. As illustrated in FIG. 1, the color filter substrate 100 has a seal member 106 disposed thereon. In this case, an area that is surrounded by the seal member 106 and in which a liquid crystal is sealed is taken as a "display area," an area that consists of the display area and an area that ranges from the outer edge of the display area to, for example, the central portion of the seal member 106 is taken as an "area B," and an area on the outside of the area B is taken as an "area A." In FIG. 1, Z-Z' corresponds to a portion that ranges from the substrate edge of the color filter substrate 100 to the inside of the display area.

Figure 2:
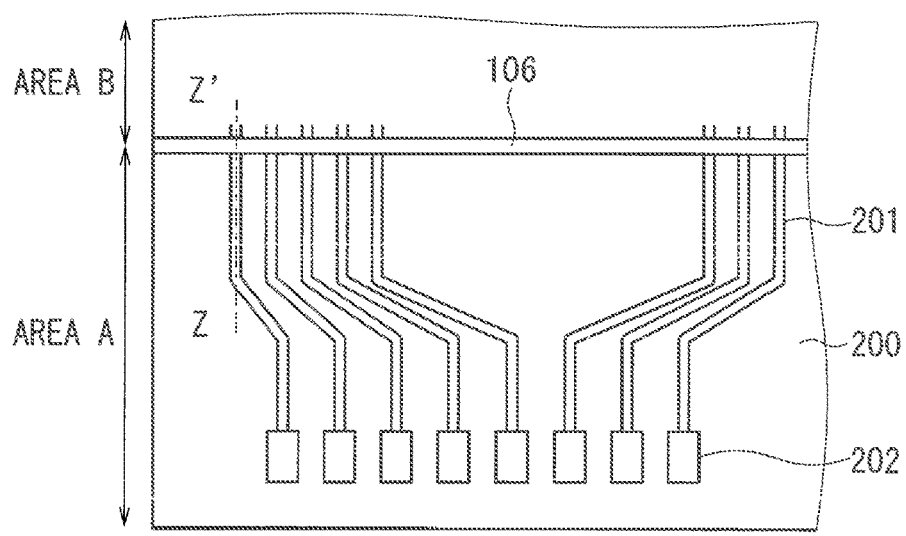
FIG. 2 illustrates the appearance of terminal lines on a TFT array substrate according to the embodiment.

FIG. 2 illustrates the appearance of terminal lines on a TFT array substrate according to the present embodiment. The seal member 106 illustrated in FIG. 2 is in such a state that the seal member 106 on the color filter substrate 100 is bonded to the TFT array substrate 200. Similarly, the areas B and A in FIG. 2 correspond to the area B on the color filter substrate 100 and the area A on the outside of the area B.

As illustrated in FIG. 2, the TFT array substrate 200 has a plurality of terminal lines 201 arranged thereon spanning the seal member 106. External connection terminals 202 are attached to the ends of the terminal lines 201.

Figure 3:
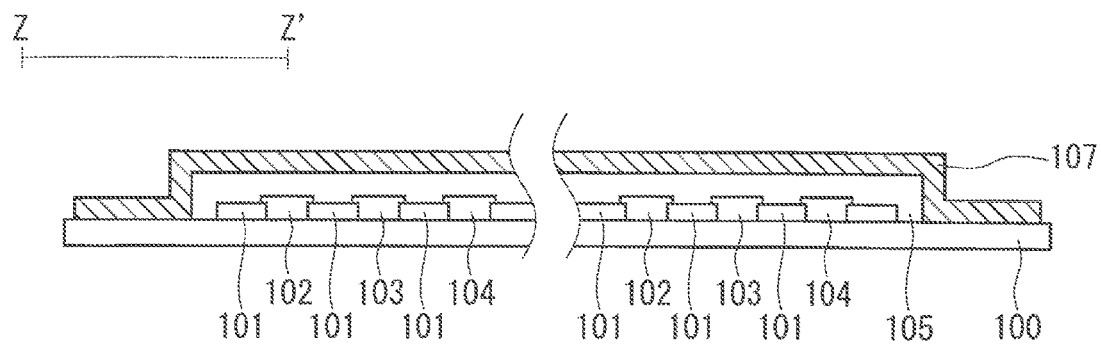
FIG. 3 is a cross-sectional view illustrating the structure of the color filter substrate according to the embodiment.
Figure 4:
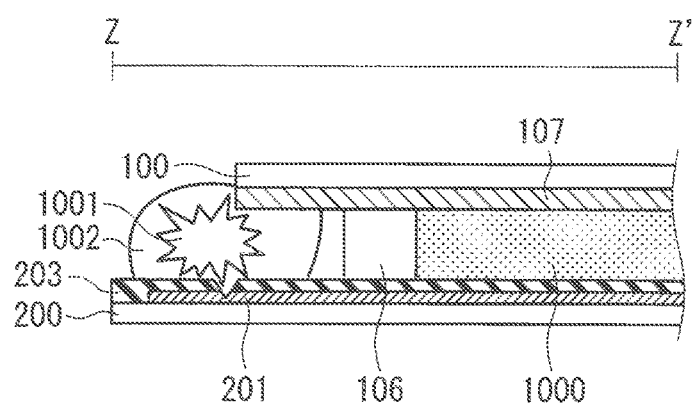
FIG. 4 is a cross-sectional view illustrating a structure corresponding to a portion taken along line Z-Z' in FIGS. 1 to 3.

FIG. 3 is a cross-sectional view illustrating the structure of the color filter substrate according to the present embodiment. FIG. 4 is a cross-sectional view illustrating the structure that corresponds to a portion taken along line Z-Z' in FIGS. 1 to 3.

The color filter substrate 100 such as glass includes color materials of RGB (a red color material 102, a green color material 103, and a blue color material 104), a black matrix 101 (hereinafter, also referred to as "BM") arranged between each color material, and an overcoat layer 105 formed to cover the red color material 102, the green color material 103, the blue color material 104, and the black matrix 101 as illustrated in FIG. 3. The red color material 102, the green color material 103, the blue color material 104, the black matrix 101, and the overcoat layer 105 are not shown in FIG. 4.

A counter electrode 107 is disposed on the underside of the color filter substrate 100 as illustrated in FIG. 4. The terminal lines 201 are formed on the TFT array substrate 200, and an insulation film 203 is formed to cover the terminal lines 201.

The color filter substrate 100 and the TFT array substrate 200 are bonded together with the seal member 106. A liquid crystal 1000 is further sealed in the space surrounded by the color filter substrate 100, the TFT array substrate 200, and the seal member 106. This space corresponds to the display area in FIG. 1.

Here, consider a case where there is a foreign substance 1001 in an area that is on the outside of and adjacent to the space in which the liquid crystal 1000 is sealed, i.e., in an area in the vicinity of the boundary between the area B and the area A, as illustrated in FIG. 4.

When there is the foreign substance 1001 at the position as illustrated in FIG. 4, the insulation film 203 covering the terminal lines 201 may be damaged by the foreign substance 1001. If this is the case, flaws in the insulation film 203 may reach and expose the terminal lines 201. This deteriorates the insulating properties of the terminal lines 201.

If, in this situation, moisture 1002 or the like adhering to the counter electrode 107 of the color filter substrate 100 enters the flaws in the insulation film 203, a conductive circuit may be formed between the counter electrode 107 on the color filter substrate 100 and the terminal lines 201 on the TFT array substrate 200 as illustrated in FIG. 4. In this case, problems such as disconnection due to electrolytic corrosion may occur.

Note that the cause of the formation of the conductive circuit between the counter electrode 107 and the terminal line 201 may be the entry of a metallic foreign substance (i.e., conductive foreign substance), instead of moisture, from flaws in the insulation film 203.

Figure 5:
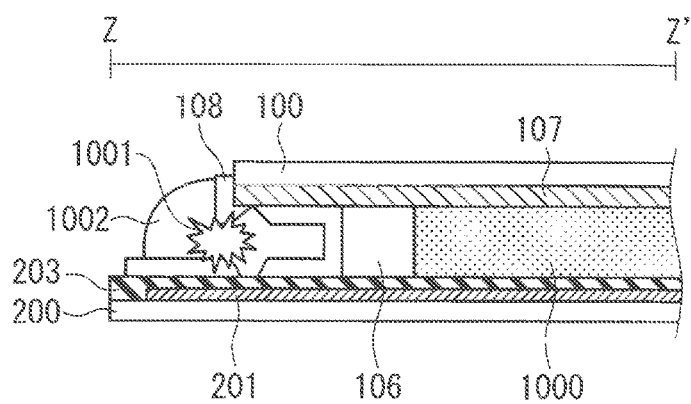
FIG. 5 is a cross-sectional view illustrating the structure corresponding to the portion taken along line Z-Z' in FIGS. 1 to 3.

FIG. 5 is a cross-sectional view illustrating the structure corresponding to the portion taken along line Z-Z' in FIGS. 1 to 3. The red color material 102, the green color material 103, the blue color material 104, the black matrix 101, and the overcoat layer 105 are not shown in FIG. 5.

In FIG. 5, a protective film 108 that covers the counter electrode 107, the seal member 106, and the insulation film 203 is formed in the area that is on the outside of and adjacent to the space in which the liquid crystal 1000 is sealed, i.e., in the area in the vicinity of the boundary between the area B and the area A.

As illustrated in FIG. 5, even if the protective film 108 is formed on the counter electrode 107 of the color filter substrate 100 and the insulation film 203 of the TFT array substrate 200, the foreign substance 1001 or the like may cause damage to the protective film 108, causing the terminal line 201 or the counter electrode 107 to be exposed. In this case, the insulating properties of the terminal line 201 are deteriorated as well.

If, in this situation, moisture 1002 or the like adhering to the counter electrode 107 of the color filter substrate 100 enters flaws in the insulation film 203, a conductive circuit may be formed between the counter electrode 107 on the color filter substrate 100 and the terminal line 201 on the TFT array substrate 200 as illustrated in FIG. 5. In this case, problems such as disconnection due to electrolytic corrosion may occur.

Figure 6:
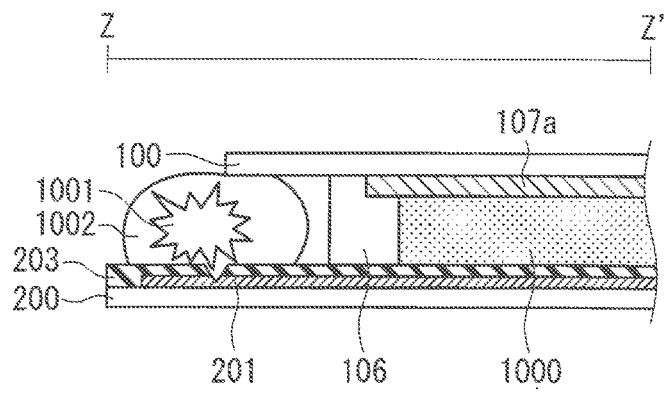
FIG. 6 is a cross-sectional view illustrating the structure corresponding to the portion taken along line Z-Z' in FIGS. 1 to 3.

FIG. 6 is a cross-sectional view illustrating the structure corresponding to the portion taken along line Z-Z' in FIGS. 1 to 3. The red color material 102, the green color material 103, the blue color material 104, the black matrix 101, and the overcoat layer 105 are not shown in FIG. 6.

In FIG. 6, the end of a counter electrode 107a is located within the seal member 106, so that the counter electrode 107a is not disposed in the area on the outside of and adjacent to the space in which the liquid crystal 1000 is sealed, i.e., in the area in the vicinity of the boundary between the area B and the area A.

The structure illustrated in FIG. 6 can be formed using a method in which a mask is previously formed on the peripheral portion of the color filter substrate 100 so that the counter electrode 107a made of a transparent conductive film such as indium tin oxide is not deposited on the peripheral portion of the color filter substrate 100. This method, however, requires an additional step for avoiding formation of the counter electrode on the peripheral portion of the color filter substrate 100.

Another example of the method for avoiding formation of the counter electrode on the peripheral portion of the color filter substrate 100 is a method in which, after a transparent conductive film such as ITO is deposited on the entire surface of the color filter substrate 100, a resist is formed by photolithography on the portion other than the peripheral portion of the color filter substrate 100; the transparent conductive film on the peripheral portion of the color filter substrate 100 is removed using an etching system; and finally the resist is removed. This method, however, also requires an additional step for avoiding formation of the counter electrode on the peripheral portion of the color filter substrate 100. Besides, in this case, a difference in level is formed by the end surface of the transparent conductive film between the portion from which the transparent conductive film is removed and the portion on which the transparent conductive film remains. This difference in level may catch foreign substances generated in the manufacturing process. Sometimes foreign substances detached from the difference in level may cause problems such as dielectric breakdown in the TFT array substrate 200.

<Manufacturing Method>

FIGS. 7 to 11 are cross-sectional views for describing a process of manufacturing the liquid crystal display according to the present embodiment.

Figure 7:
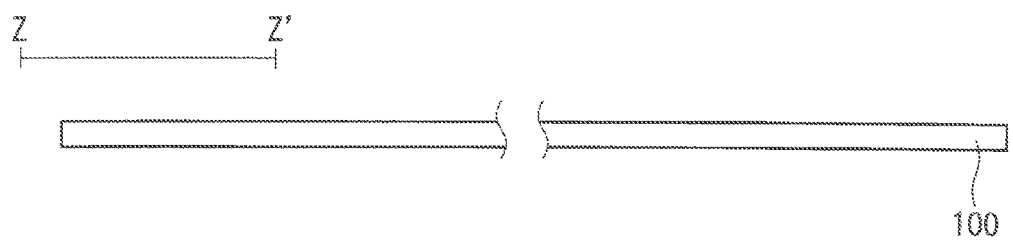
FIG. 7 is a cross-sectional view for describing a process of manufacturing a liquid crystal display according to the embodiment.
Figure 8:
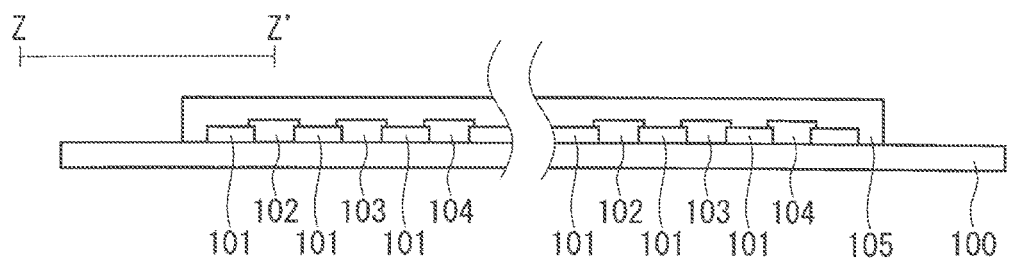
FIG. 8 is a cross-sectional view for describing the process of manufacturing the liquid crystal display according to the embodiment.

First, the color filter substrate 100 such as glass is prepared as illustrated in FIG. 7. Then, the black matrix 101, the red color material 102, the green color material 103, and the blue color material 104 are formed on the color filter substrate 100 as illustrated in FIG. 8. The overcoat layer 105 is further formed as necessary to cover the black matrix 101, the red color material 102, the green color material 103, and the blue color material 104.

Figure 9:
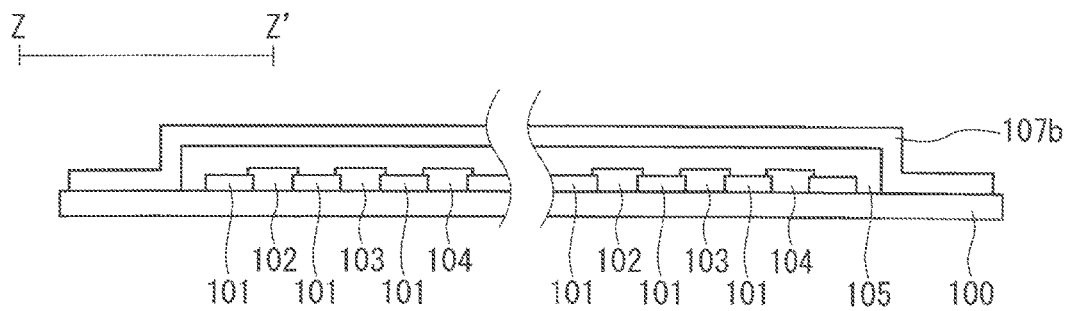
FIG. 9 is a cross-sectional view for describing the process of manufacturing the liquid crystal display according to the embodiment.

Next, an oxide semiconductor film 107b that is to be the counter electrode is formed on the entire surface of the color filter substrate 100 as illustrated in FIG. 9. More specifically, IGZO (which is an abbreviated name for an amorphous semiconductor consisting of indium, gallium, zinc, and oxide) is deposited to a thickness of approximately 80 nm, using a sputtering system. The oxide semiconductor film 107b, which is to be the counter electrode, desirably has resistivity that is greater than or equal to approximately $1 \times 10^2$ Ω·cm and less than or equal to approximately $1 \times 10^5$ Ω·cm.

Figure 10:
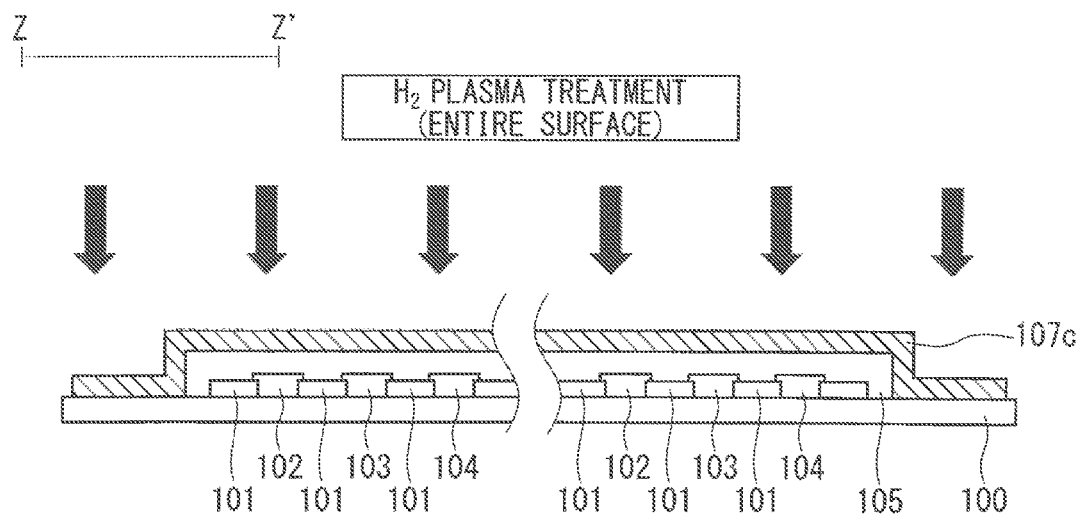
FIG. 10 is a cross-sectional view for describing the process of manufacturing the liquid crystal display according to the embodiment.

Next, $H_2$ plasma treatment is performed on the entire surface of the color filter substrate 100, using for example plasma equipment, as illustrated in FIG. 10. This treatment changes the resistivity of the oxide semiconductor film 107c, which is to be the counter electrode, to a value less than or equal to approximately $1 \times 10^{-3}$ Ω·cm and transforms the oxide semiconductor film 107c from semiconductor to conductor. Note that the above $H_2$ plasma treatment may be performed on at least a portion of the oxide semiconductor film that corresponds to the display area. The same applies to the following description.

Figure 11:
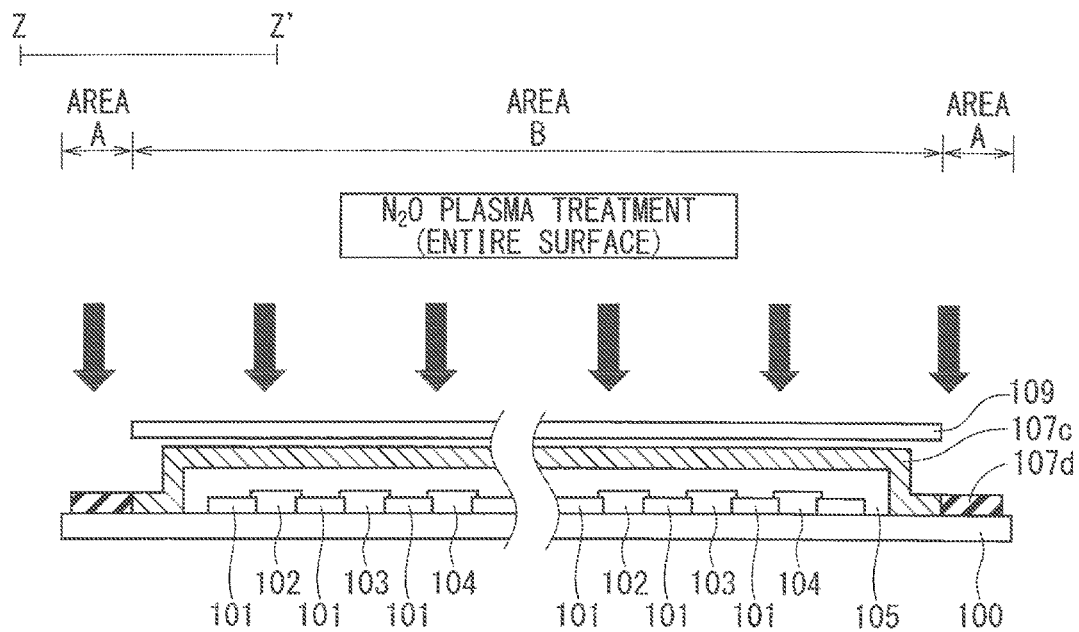
FIG. 11 is a cross-sectional view for describing the process of manufacturing the liquid crystal display according to the embodiment.

Next, the area B that includes part of the seal member 106 is shielded with a metallic mask 109 as illustrated in FIG. 11. Then, plasma treatment using gas that contains at least $N_2O$ is performed on the entire surface of the color filter substrate 100, using for example plasma equipment. Note that the above plasma treatment using the $N_2O$-containing gas may be performed on at least a portion of the oxide semiconductor film that corresponds to the outside of the display area. The same applies to the following description.

In the area A on the substrate end side that is not masked and that includes part of the seal member 106, the oxide semiconductor film 107d, which is to be the counter electrode, is transformed from conductor to insulator. The resistivity of the oxide semiconductor film 107d at this time is greater than or equal to approximately $1 \times 10^7$ Ω·cm. That is, the oxide semiconductor film 107c in the area B of the counter electrode is a conductor, and the oxide semiconductor film 107d in the area A on the outside of the seal member is an insulator.

Although subsequent steps are not shown, a columnar spacer for forming a gap may be formed next as necessary. In this way, the color filter substrate 100 is completed. Note that the columnar spacer may be a spacer formed by the spreading of particles.

Next, a resin film such as polyimide that serves as an alignment layer is formed on the display area of the color filter substrate 100 and on the TFT array substrate 200. Then, alignment processing for rubbing the surfaces of the resin films is performed.

Then, the TFT array substrate 200 and the color filter substrate 100 are bonded together with the seal member 106 so that the substrates oppose each other.

After a liquid crystal is injected into the display area, which is the space on the inside of the seal member 106, sealing and other necessary processing are performed to complete the liquid crystal panel.

Figure 12:
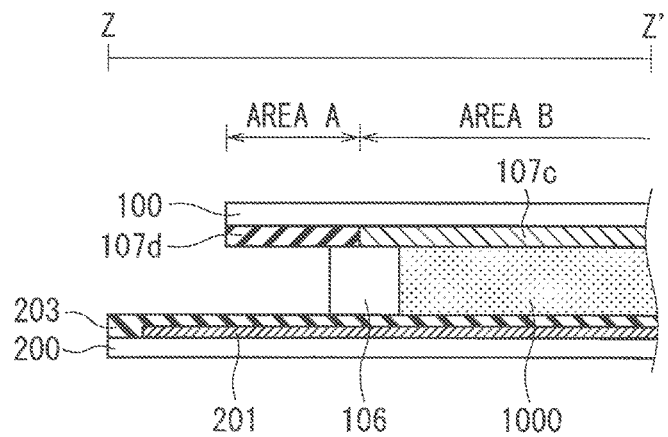
FIG. 12 is a cross-sectional view illustrating the structure corresponding to the portion taken along line Z-Z' in FIGS. 1 to 3.

FIG. 12 is a cross-sectional view illustrating the structure corresponding to the portion taken along line Z-Z' in FIGS. 1 to 3. Note that constituent elements such as the red color material 102, the green color material 103, the blue color material 104, the black matrix 101, the overcoat layer 105, the columnar spacer, the alignment layer on the TFT array substrate 200, and the alignment layer on the color filter substrate 100 are not shown in FIG. 12.

In FIG. 12, the oxide semiconductor film 107*c*, which is the counter electrode in the area B, exhibits the properties of a conductor. The oxide semiconductor film 107*d*, which is the counter electrode in the area A, exhibits the properties of an insulator.

On the color filter substrate 100, the oxide semiconductor film 107*d*, which is the counter electrode in the area A, is an insulator film. Thus, even if the insulating properties of the insulation film 203 on the terminal lines 201 of the TFT array substrate 200 deteriorate due to the insulation film 203 being damaged by a foreign substance and moreover if moisture or the like enters into the clearance of the insulation film 203 formed by the foreign substance in a high humidity environment, no conductive circuit is formed between the terminal lines 201 on the TFT array substrate 200 and the counter electrode on the color filter substrate 100. It is thus possible to prevent the occurrence of defects such as disconnection due to electrolytic corrosion.

Even if a metallic foreign substance (i.e., conductor foreign substance), instead of moisture, enters into the clearance of the insulation film, no continuity is established for the same reason, i.e., because the counter electrode is an insulation film.

With the method illustrated in the present embodiment, there is no difference in level between the oxide semiconductor film 107*c* and the oxide semiconductor film 107*d* as illustrated in FIG. 11. It is thus possible to reduce the occurrence of problems which may be caused by the capture of a foreign substance at the difference in level and detachment of the captured foreign substance.

Second Embodiment

Another liquid crystal display will now be described as one example of a display according to another embodiment of the present invention. Hereinafter, constituent elements that are similar to those described in the above-described embodiment are given the same reference numerals, and detailed description thereof is appropriately omitted.

<Manufacturing Method>

FIGS. 13 to 17 are cross-sectional views for describing a process of manufacturing the liquid crystal display according to the present embodiment.

Figure 13:
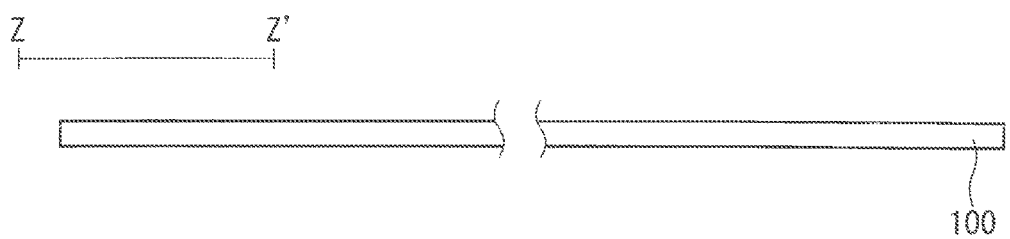
FIG. 13 is a cross-sectional view for describing a process of manufacturing a liquid crystal display according to an embodiment.
Figure 14:
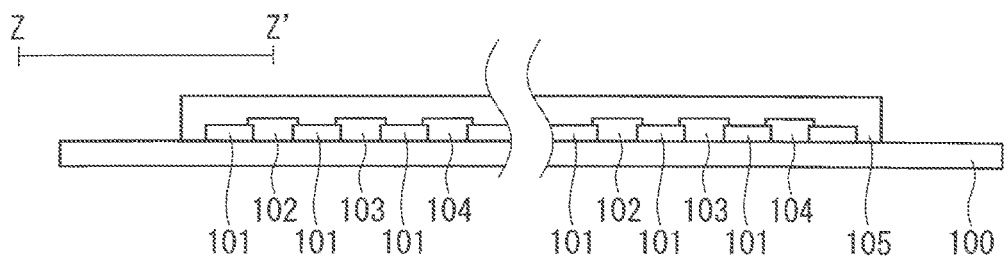
FIG. 14 is a cross-sectional view for describing the process of manufacturing the liquid crystal display according to the embodiment.
Figure 15:
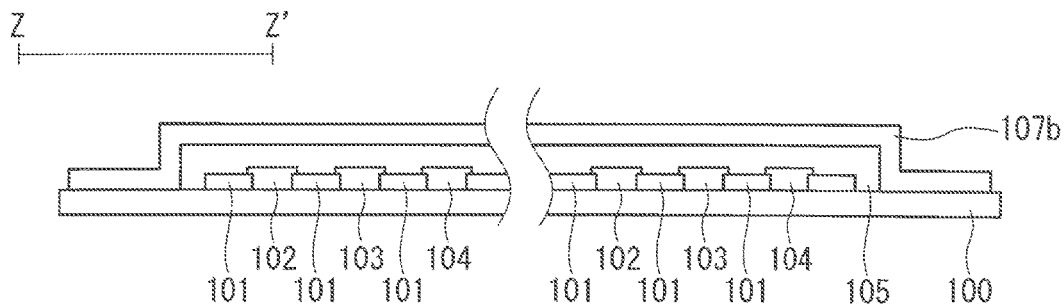
FIG. 15 is a cross-sectional view for describing the process of manufacturing the liquid crystal display according to the embodiment.

FIGS. 13 to 15 are similar to those described in the first embodiment, and therefore description thereof is omitted.

Figure 16:
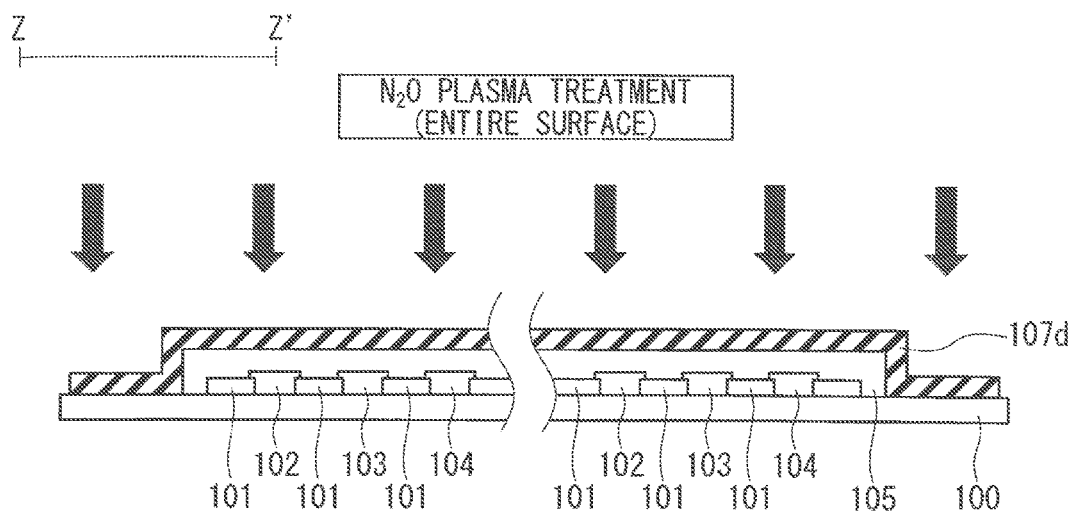
FIG. 16 is a cross-sectional view for describing the process of manufacturing the liquid crystal display according to the embodiment.

Next, plasma treatment using gas that contains at least $N_2O$ is performed on the entire surface of the color filter substrate 100, using for example plasma equipment, as illustrated in FIG. 16. This treatment transforms the property of the oxide semiconductor film 107*d*, which is to be the counter electrode, from semiconductor to insulator. The resistivity of the oxide semiconductor film 107*d* at this time is greater than or equal to approximately $1 \times 10^7$ Ω·cm.

Figure 17:
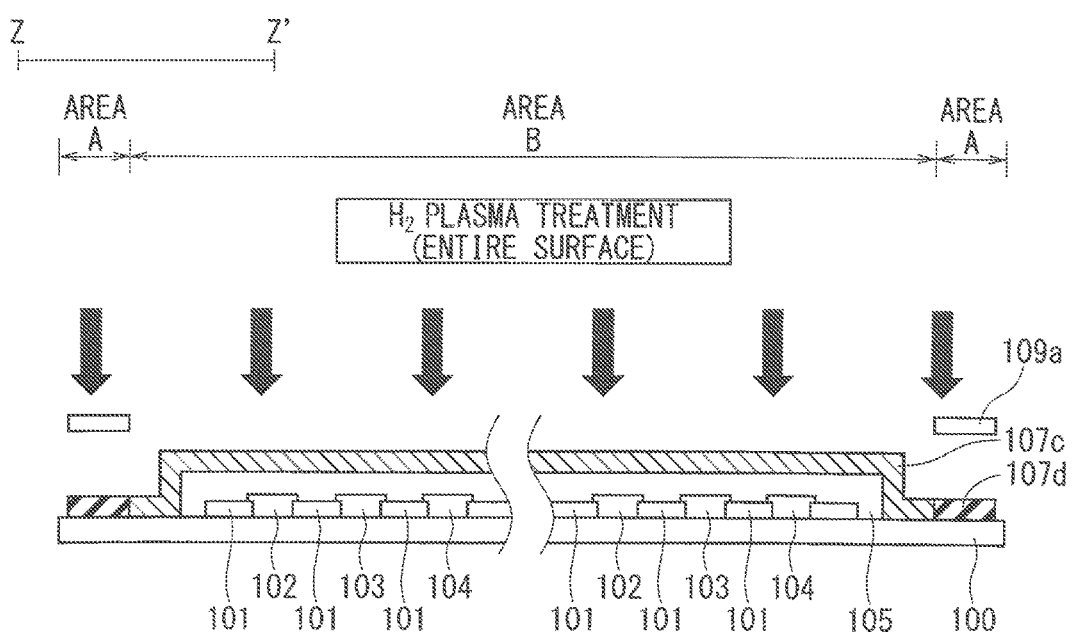
FIG. 17 is a cross-sectional view for describing the process of manufacturing the liquid crystal display according to the embodiment.
Figure 18:
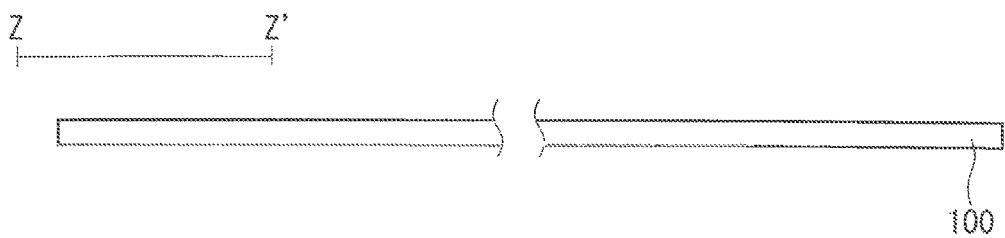
FIG. 18 is a cross-sectional view for describing the process of manufacturing a liquid crystal display according to an embodiment.
Figure 19:
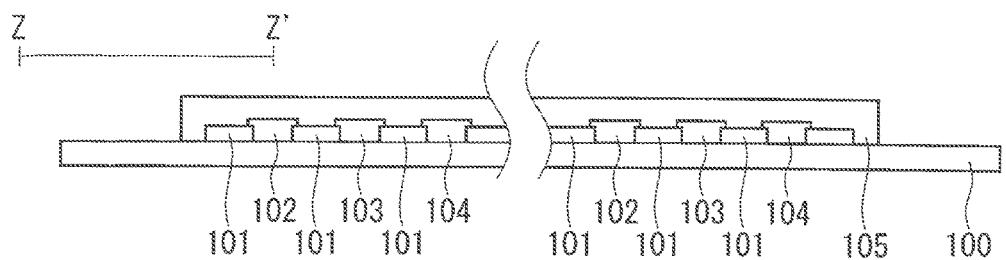
FIG. 19 is a cross-sectional view for describing the process of manufacturing the liquid crystal display according to the embodiment.
Figure 20:
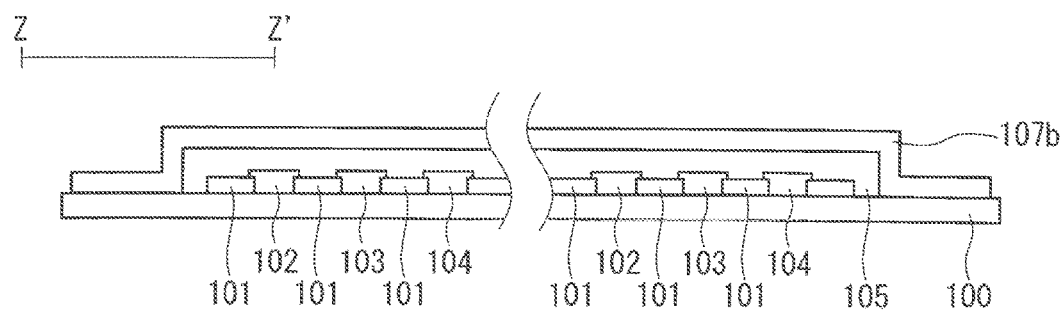
FIG. 20 is a cross-sectional view for describing the process of manufacturing the liquid crystal display according to the embodiment.
Figure 21:
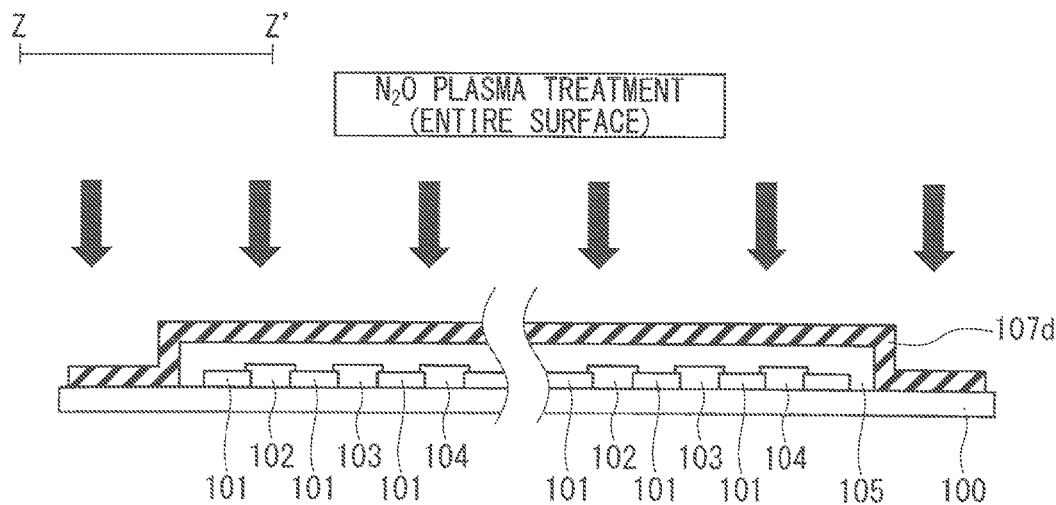
FIG. 21 is a cross-sectional view for describing the process of manufacturing the liquid crystal display according to the embodiment.

Next, the area A corresponding to the area on the substrate end side that includes part of the seal member 106 is shielded with, for example, a metallic mask 109*a* as illustrated in FIG. 17. Then, $H_2$ plasma treatment is performed on the entire surface of the color filter substrate 100, using for example plasma equipment.

In the area B that is not masked and that includes part of the seal member 106, the property of the oxide semiconductor film 107*c*, which is to be the counter electrode, is transformed from insulator to conductor. The resistivity of the oxide semiconductor film 107*c* at this time is less than or equal to approximately $1 \times 10^{-3}$ Ω·cm. That is, the oxide semiconductor film 107*c* in the area B of the counter electrode is a conductor, and the oxide semiconductor film 107*d* in the area A on the outside of the seal member is an insulator.

Subsequent steps are similar to those described in the first embodiment, and therefore description thereof is omitted.

Although subsequent steps are not shown, a columnar spacer for forming a gap may be formed next as necessary. In this way, the color filter substrate 100 is completed. Note that the columnar spacer may be a spacer formed by the spreading of particles.

Next, a resin film such as polyimide that serves as an alignment layer is formed on the display area of the color filter substrate 100 and on the TFT array substrate 200. Then, alignment processing for rubbing the surfaces of the resin films is performed.

Then, the TFT array substrate 200 and the color filter substrate 100 are bonded together with the seal member 106 so that the substrates oppose each other.

After a liquid crystal is injected into the display area, which is the space on the inside of the seal member 106, sealing and other necessary processing are performed to complete the liquid crystal panel.

FIG. 12 is a cross-sectional view illustrating the structure corresponding to the portion taken along line Z-Z' in FIGS. 1 to 3. Note that constituent elements such as the red color material 102, the green color material 103, the blue color material 104, the black matrix 101, the overcoat layer 105, the columnar spacer, the alignment layer on the TFT array substrate 200, and the alignment layer on the color filter substrate 100 are not shown in FIG. 12.

In FIG. 12, the oxide semiconductor film 107*c*, which is the counter electrode in the area B, exhibits the properties of a conductor. The oxide semiconductor film 107*d*, which is the counter electrode in the area A, exhibits the properties of an insulator.

On the color filter substrate 100, the oxide semiconductor film 107*d*, which is the counter electrode in the area A, is an insulator film. Thus, even if the insulating properties of the insulation film 203 on the terminal lines 201 of the TFT array substrate 200 deteriorate due to the insulation film 203 being damaged by a foreign substance and moreover if moisture or the like enters into the clearance of the insulation film 203 formed by the foreign substance in a high humidity environment, no conductive circuit is formed between the terminal lines 201 on the TFT array substrate 200 and the counter electrode on the color filter substrate 100. It is thus possible to prevent the occurrence of defects such as disconnection due to electrolytic corrosion.

Even if a metallic foreign substance (i.e., conductor foreign substance), instead of moisture, enters into the clearance of the insulation film, no continuity is established for the same reason, i.e., because the counter electrode is an insulation film.

Third Embodiment

Another liquid crystal display will now be described as one example of a display according to another embodiment of the present invention. Hereinafter, constituent elements that are similar to those described in the above-described embodiment are given the same reference numerals, and detailed description thereof is appropriately omitted.

<Manufacturing Method>

FIGS. 18 to 23 are cross-sectional views for describing a process of manufacturing the liquid crystal display according to the present embodiment.

FIGS. 18 to 21 are similar to those described in the second embodiment, and therefore description thereof is omitted.

Figure 22:
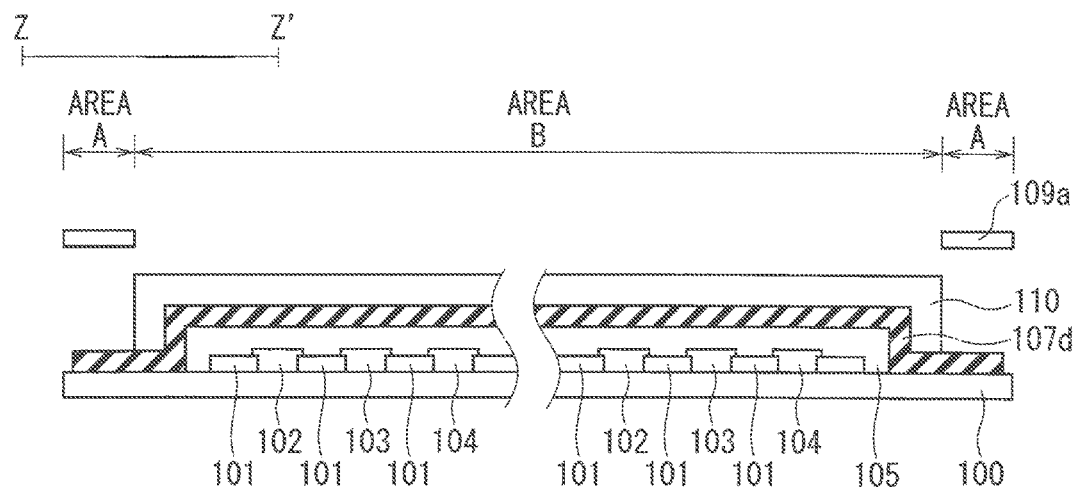
FIG. 22 is a cross-sectional view for describing the process of manufacturing the liquid crystal display according to the embodiment.

Next, the area A corresponding to the area on the substrate end side that includes part of the seal member 106 is shielded with, for example, a metallic mask 109a as illustrated in FIG. 22. Then, a silicon oxide (SiO) film is deposited to a thickness of approximately 50 nm, using for example a CVD system.

As a result, a silicon oxide film 110 is formed in the area B that is not masked and includes part of the seal member 106.

Figure 23:
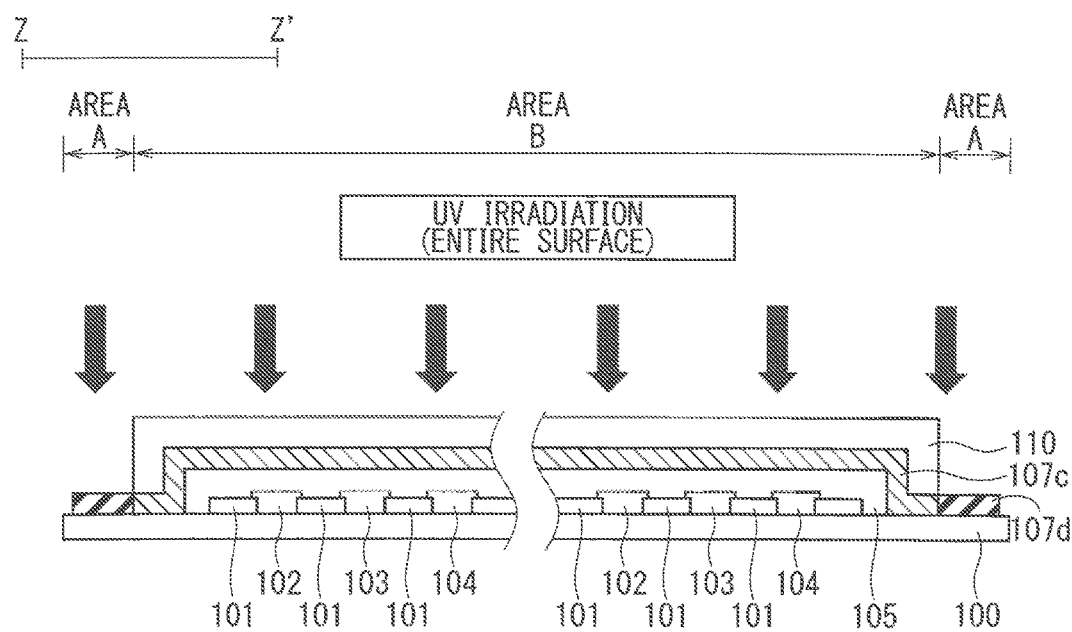
FIG. 23 is a cross-sectional view for describing the process of manufacturing the liquid crystal display according to the embodiment.

Next, the entire surface of the color filter substrate 100 is irradiated with ultraviolet rays (UV), using for example a low-pressure mercury lamp, as illustrated in FIG. 23. This treatment transforms only the oxide semiconductor film that is in contact with the silicon oxide film 110 from insulator to conductor. The resistivity at this time is less than or equal to approximately $1 \times 10^{-2}$ $\Omega \cdot cm$. That is, the oxide semiconductor film 107c in the area B of the counter electrode is a conductor, and the oxide semiconductor film 107d in the area A on the outside of the seal member is an insulator. Note that the above treatment for applying ultraviolet rays (UV) may be performed on at least a portion of the oxide semiconductor film that corresponds to the display area. The same applies to the following description.

Although subsequent steps are not shown, a columnar spacer for forming a gap may be formed next as necessary. In this way, the color filter substrate 100 is completed. Note that the columnar spacer may be a spacer formed by the spreading of particles.

Next, a resin film such as polyimide that serves as an alignment layer is formed on the display area of the color filter substrate 100 and on the TFT array substrate 200. Then, alignment processing for rubbing the surfaces of the resin films is performed.

Then, the TFT array substrate 200 and the color filter substrate 100 are bonded together with the seal member 106 so that the substrates oppose each other.

After a liquid crystal is injected into the display area, which is the space on the inside of the seal member 106, sealing and other necessary processing are performed to complete the liquid crystal panel.

Figure 24:
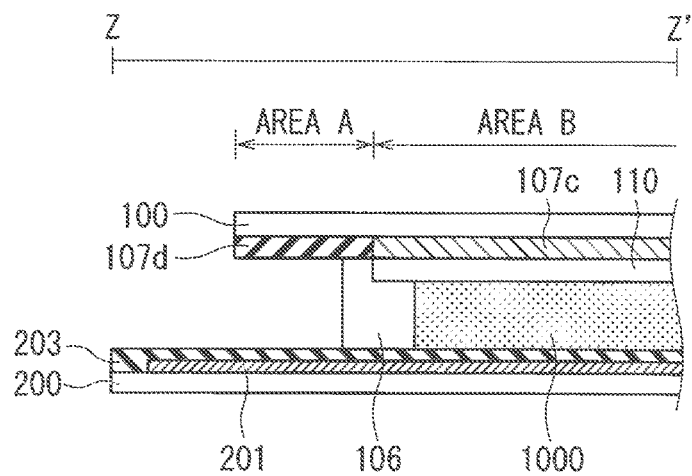
FIG. 24 is a cross-sectional view illustrating the structure corresponding to the portion taken along line Z-Z' in FIGS. 1 to 3.

FIG. 24 is a cross-sectional view illustrating the structure corresponding to the portion taken along line Z-Z' in FIGS. 1 to 3. Note that constituent elements such as the red color material 102, the green color material 103, the blue color material 104, the black matrix 101, the overcoat layer 105, the columnar spacer, the alignment layer on the TFT array substrate 200, and the alignment layer on the color filter substrate 100 are not shown in FIG. 24.

In FIG. 24, the oxide semiconductor film 107c, which is the counter electrode in the area B, exhibits the properties of a conductor. The oxide semiconductor film 107d, which is the counter electrode in the area A, exhibits the properties of an insulator. Moreover, the silicon oxide film 110 is formed on the oxide semiconductor film 107c which is the counter electrode in the area B, i.e., on the surface of the oxide semiconductor film 107c on the side opposite to the side in contact with the color filter substrate 100.

On the color filter substrate 100, the oxide semiconductor film 107d, which is the counter electrode in the area A, is an insulator film. Thus, even if the insulating properties of the insulation film 203 on the terminal lines 201 of the TFT array substrate 200 deteriorate due to the insulation film 203 being damaged by a foreign substance and moreover if moisture or the like enters into the clearance of the insulation film 203 formed by the foreign substance in a high humidity environment, no conductive circuit is formed between the terminal lines 201 on the TFT array substrate 200 and the counter electrode on the color filter substrate 100. It is thus possible to prevent the occurrence of defects such as disconnection due to electrolytic corrosion.

Even if a metallic foreign substance (i.e., conductor foreign substance), instead of moisture, enters into the clearance of the insulation film, no continuity is established for the same reason, i.e., because the counter electrode is an insulation film.

Fourth Embodiment

Another liquid crystal display will now be described as one example of a display according to another embodiment of the present invention. Hereinafter, constituent elements that are similar to those described in the above-described embodiment are given the same reference numerals, and detailed description thereof is appropriately omitted.

<Manufacturing Method>

While the third embodiment describes the structure in which the silicon oxide film 110 is formed on the counter electrode, the present embodiment describes a structure in which a silicon oxide film 110a is formed under the counter electrode.

FIGS. 25 to 30 are cross-sectional views for describing a process of manufacturing the liquid crystal display according to the present embodiment.

Figure 25:
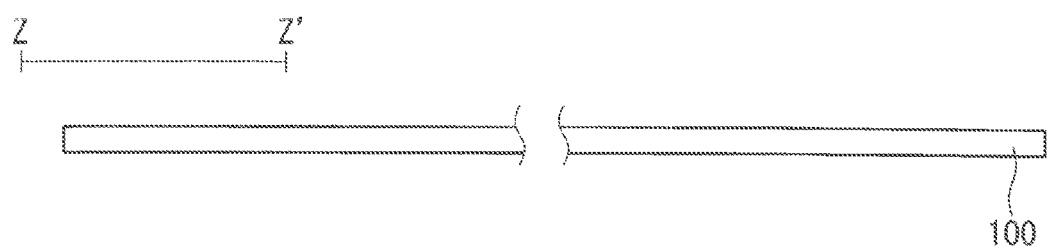
FIG. 25 is a cross-sectional view for describing a process of manufacturing a liquid crystal display according to an embodiment.
Figure 26:
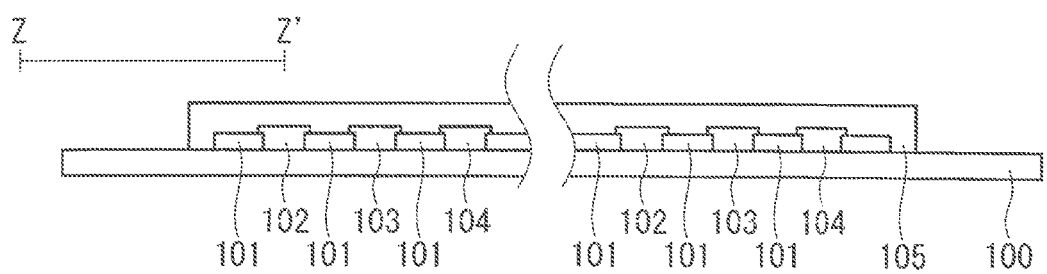
FIG. 26 is a cross-sectional view for describing the process of manufacturing the liquid crystal display according to the embodiment.

FIGS. 25 and 26 are similar to those described in the third embodiment, and therefore description thereof is omitted.

Figure 27:
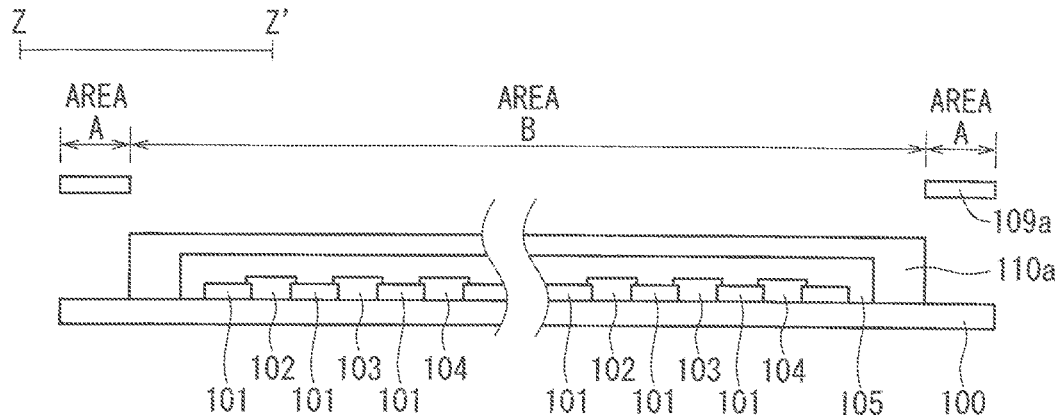
FIG. 27 is a cross-sectional view for describing the process of manufacturing the liquid crystal display according to the embodiment.

Next, the area A corresponding to the area on the substrate end side that includes part of the seal member 106 is shielded with, for example, the metallic mask 109a as illustrated in FIG. 27. Then, a silicon oxide (SiO) film is deposited to a thickness of approximately 50 nm, using for example a CVD system.

As a result, a silicon oxide film 110a is formed in the area B that is not masked and that includes part of the seal member 106.

Figure 28:
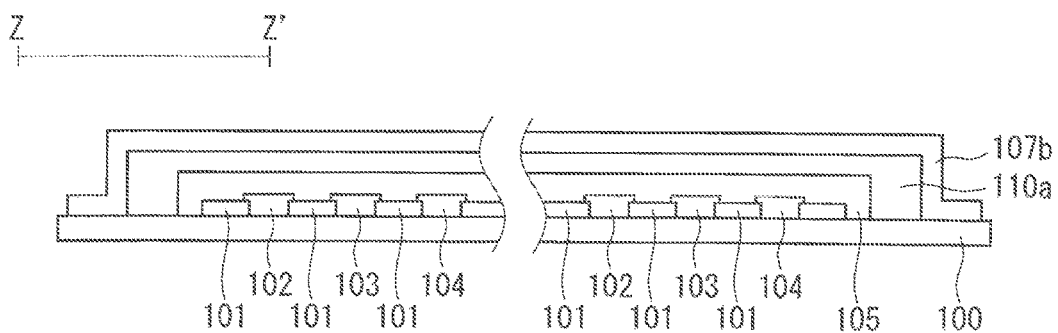
FIG. 28 is a cross-sectional view for describing the process of manufacturing the liquid crystal display according to the embodiment.

Next, the oxide semiconductor film 107b, which is to be the counter electrode, is formed on the entire surface of the color filter substrate 100 as illustrated in FIG. 28. More specifically, IGZO is deposited to a thickness of approximately 80 nm, using a sputtering system. The oxide semiconductor film 107b, which is to be the counter electrode, desirably has resistivity that is greater than or equal to approximately $1 \times 10^{2}$ $\Omega \cdot cm$ and less than or equal to approximately $1 \times 10^{5}$ $\Omega \cdot cm$.

Figure 29:
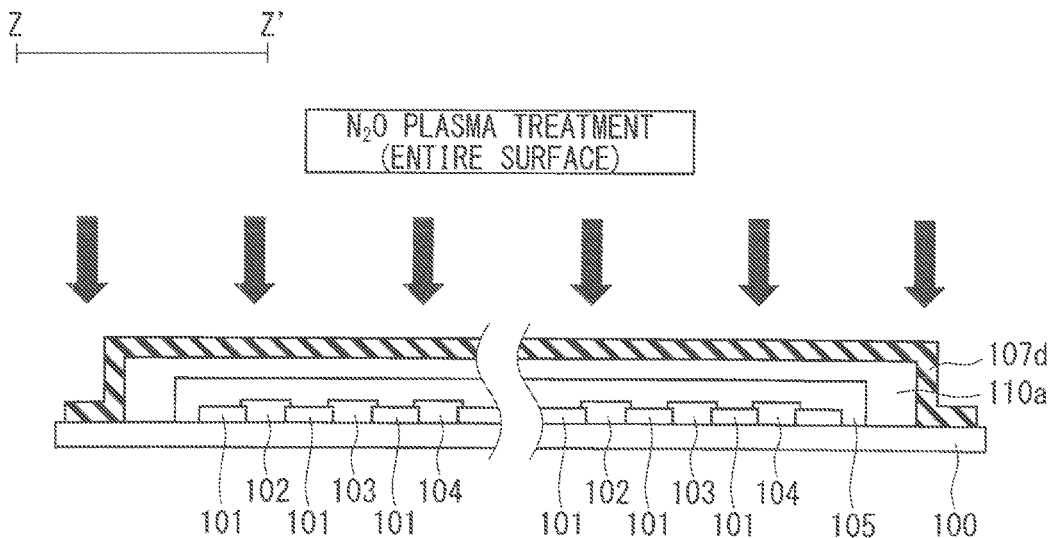
FIG. 29 is a cross-sectional view for describing the process of manufacturing the liquid crystal display according to the embodiment.

Next, as illustrated in FIG. 29, plasma treatment using gas that contains at least $N_2O$ is performed on the entire surface of the color filter substrate 100, using for example plasma equipment. This treatment changes the resistivity of the oxide semiconductor film 107d, which is to be the counter electrode, to a value greater than or equal to approximately $1\times10^7$ Ω·cm and transforms the property of the oxide semiconductor film from semiconductor to insulator.

Figure 30:
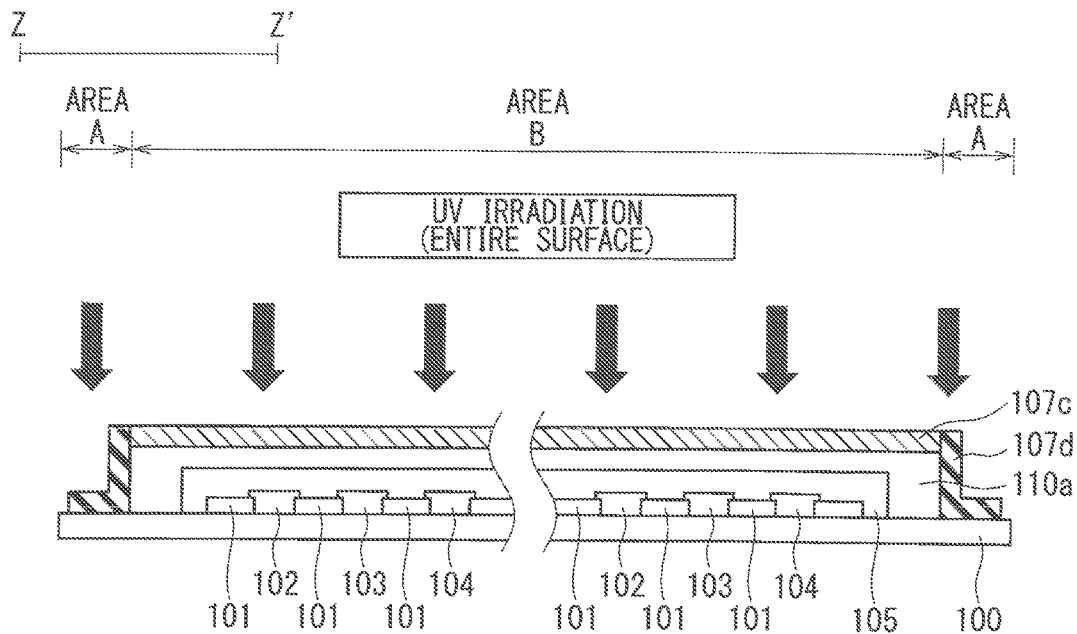
FIG. 30 is a cross-sectional view for describing the process of manufacturing the liquid crystal display according to the embodiment.

Next, the entire surface of the color filter substrate 100 is irradiated with ultraviolet rays (UV), using for example a low-pressure mercury lamp, as illustrated in FIG. 30. This treatment transforms only the counter electrode that is in contact with the silicon oxide film 110a from insulator to conductor. The resistivity at this time is less than or equal to approximately $1\times10^{-2}$ Ω·cm. That is, the oxide semiconductor film 107c in the area B of the counter electrode is a conductor, and the oxide semiconductor film 107d in the area A on the outside of the seal member is an insulator.

Although subsequent steps are not shown, a columnar spacer for forming a gap may be formed next as necessary. In this way, the color filter substrate 100 is completed. Note that the columnar spacer may be a spacer formed by the spreading of particles.

Next, a resin film such as polyimide that serves as an alignment layer is formed on the display area of the color filter substrate 100 and on the TFT array substrate 200. Then, alignment processing for rubbing the surfaces of the resin films is performed.

Then, the TFT array substrate 200 and the color filter substrate 100 are bonded together with the seal member 106 so that the substrates oppose each other.

After a liquid crystal is injected into the display area, which is the space on the inside of the seal member 106, sealing and other necessary processing are performed to complete the liquid crystal panel.

Figure 31:
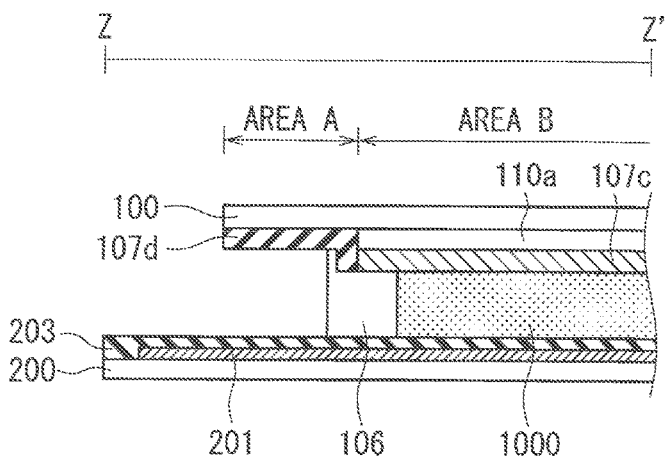
FIG. 31 is a cross-sectional view illustrating the structure corresponding to the portion taken along line Z-Z' in FIGS. 1 to 3.
Figure 32:
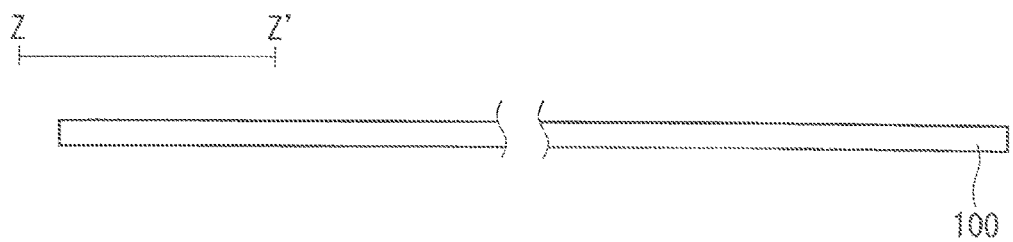
FIG. 32 is a cross-sectional view for describing a process of manufacturing a liquid crystal display according to an embodiment.
Figure 33:
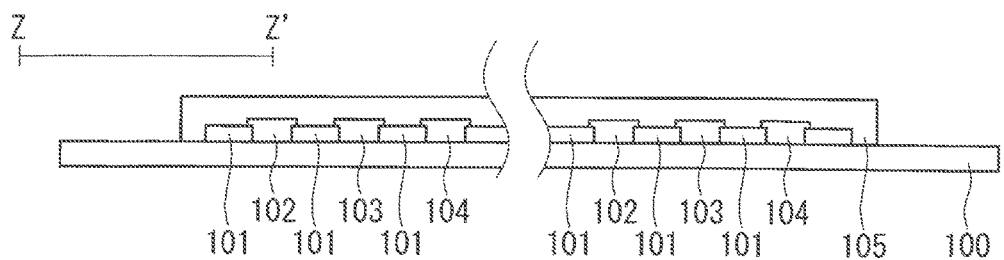
FIG. 33 is a cross-sectional view for describing the process of manufacturing the liquid crystal display according to the embodiment.
Figure 34:
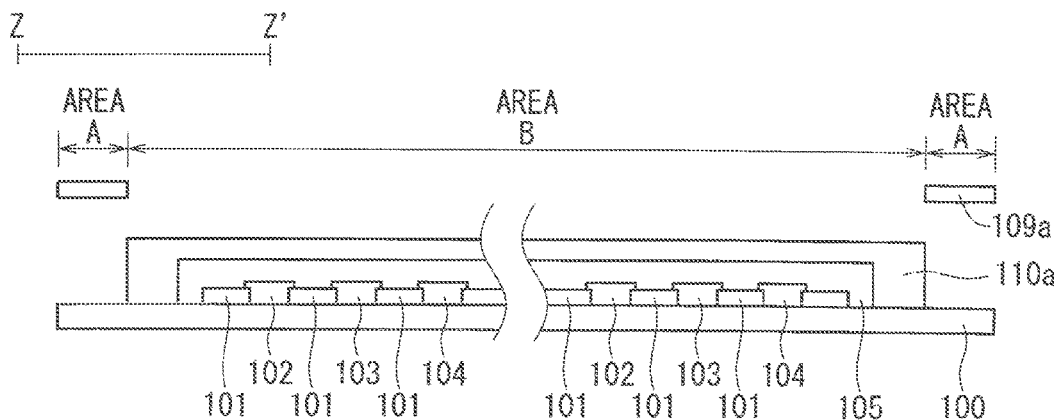
FIG. 34 is a cross-sectional view for describing the process of manufacturing the liquid crystal display according to the embodiment.
Figure 35:
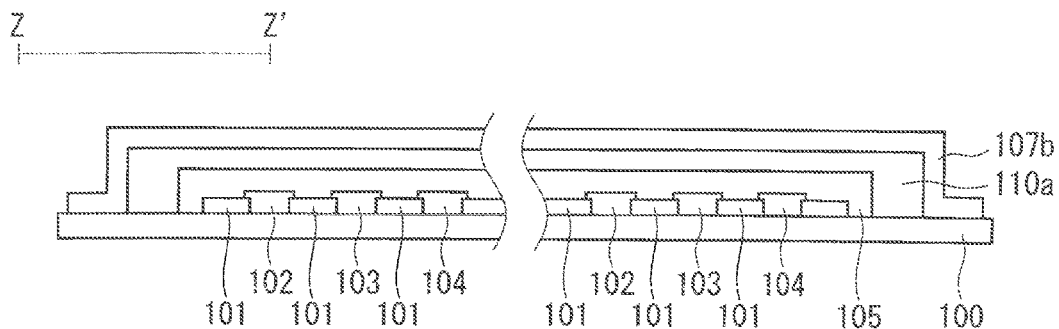
FIG. 35 is a cross-sectional view for describing the process of manufacturing the liquid crystal display according to the embodiment.

FIG. 31 is a cross-sectional view illustrating the structure corresponding to the portion taken along line Z-Z' in FIGS. 1 to 3. Note that constituent elements such as the red color material 102, the green color material 103, the blue color material 104, the black matrix 101, the overcoat layer 105, the columnar spacer, the alignment layer on the TFT array substrate 200, and the alignment layer on the color filter substrate 100 are not shown in FIG. 31.

In FIG. 31, the oxide semiconductor film 107c, which is the counter electrode in the area B, exhibits the properties of a conductor. The oxide semiconductor film 107d, which is the counter electrode in the area A, exhibits the properties of an insulator. Moreover, the silicon oxide film 110a is formed under the oxide semiconductor film 107c which is the counter electrode in the area B, i.e., formed between the color filter substrate 100 and the oxide semiconductor film 107c.

On the color filter substrate 100, the oxide semiconductor film 107d, which is the counter electrode in the area A, is an insulator film. Thus, even if the insulating properties of the insulation film 203 on the terminal lines 201 of the TFT array substrate 200 deteriorate due to the insulation film 203 being damaged by a foreign substance and moreover if moisture or the like enters into the clearance of the insulation film 203 formed by the foreign substance in a high humidity environment, no conductive circuit is formed between the terminal lines 201 on the TFT array substrate 200 and the counter electrode on the color filter substrate 100. It is thus possible to prevent the occurrence of defects such as disconnection due to electrolytic corrosion.

Even if a metallic foreign substance (i.e., conductor foreign substance), instead of moisture, enters into the clearance of the insulation film, no continuity is established for the same reason, i.e., because the counter electrode is an insulation film.

Fifth Embodiment

Another liquid crystal display will now be described as one example of a display according to another embodiment of the present invention. Hereinafter, constituent elements that are similar to those described in the above-described embodiment are given the same reference numerals, and detailed description thereof is appropriately omitted.

<Manufacturing Method>

FIGS. 32 to 37 are cross-sectional views for describing a process of manufacturing the liquid crystal display according to the present embodiment.

FIGS. 32 to 35 are similar to those described in the fourth embodiment, and therefore description thereof is omitted.

Figure 36:
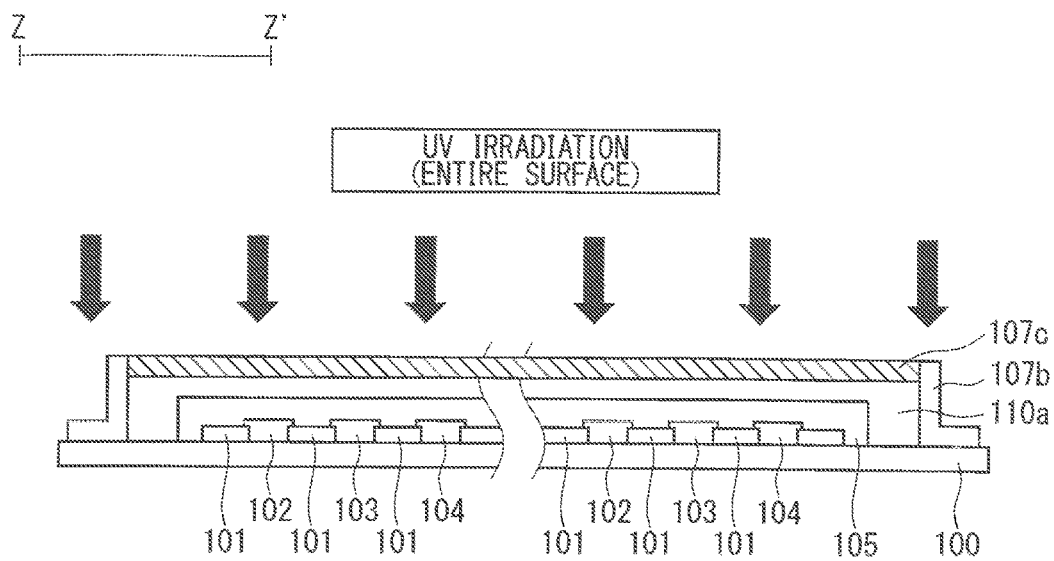
FIG. 36 is a cross-sectional view for describing the process of manufacturing the liquid crystal display according to the embodiment.

Next, the entire surface of the color filter substrate 100 is irradiated with ultraviolet rays (UV), using for example a low-pressure mercury lamp, as illustrated in FIG. 36. This treatment transforms only the counter electrode that is in contact with the silicon oxide film 110a from semiconductor to conductor. The resistivity at this time is less than or equal to approximately $1\times10^{-2}$ Ω·cm. That is, the oxide semiconductor film 107c in the area B of the counter electrode is a conductor, and the oxide semiconductor film 107b in the area A on the outside of the seal member remains as a semiconductor.

Figure 37:
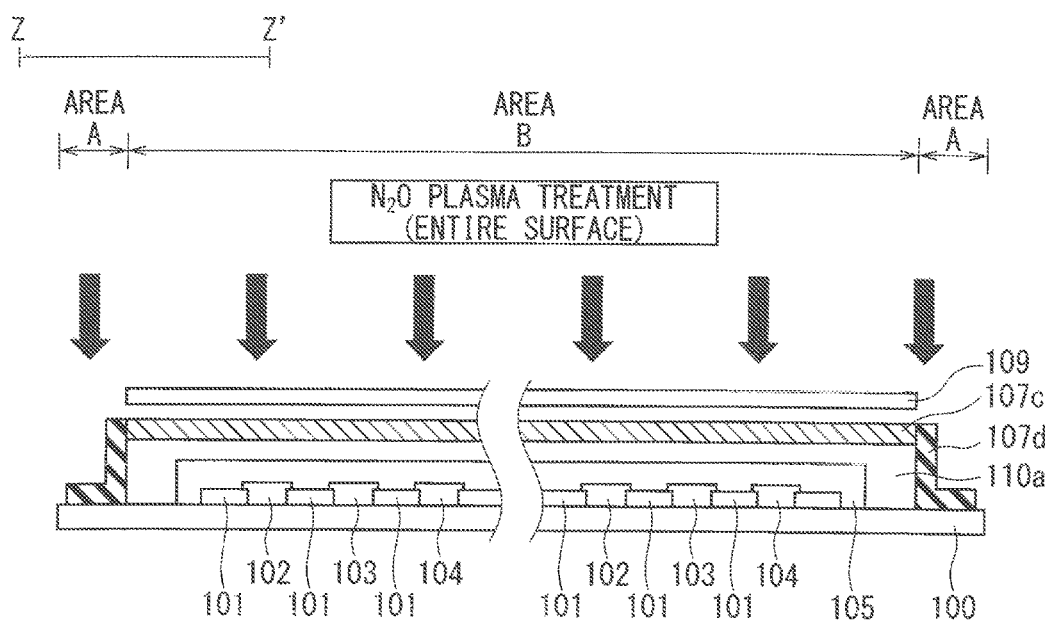
FIG. 37 is a cross-sectional view for describing the process of manufacturing the liquid crystal display according to the embodiment.

Next, the area B that includes part of the seal member 106 is shielded with, for example, the metallic mask 109 as illustrated in FIG. 37. Then, plasma treatment using gas that contains at least $N_2O$ is performed on the entire surface of the color filter substrate 100, using for example plasma equipment.

In the area A on the substrate end side that is not masked and that includes part of the seal member 106, the property of the oxide semiconductor film 107d, which is to be the counter electrode, is transformed from semiconductor to insulator. The resistivity of the oxide semiconductor film 107d at this time is greater than or equal to approximately $1\times10^7$ Ω·cm. That is, the oxide semiconductor film 107c in the area B of the counter electrode is a conductor, and the oxide semiconductor film 107d in the area A on the outside of the seal member is an insulator.

Although subsequent steps are not shown, a columnar spacer for forming a gap may be formed next as necessary. In this way, the color filter substrate 100 is completed. Note that the columnar spacer may be a spacer formed by the spreading of particles.

Next, a resin film such as polyimide that serves as an alignment layer is formed on the display area of the color filter substrate 100 and on the TFT array substrate 200. Then, alignment processing for rubbing the surfaces of the resin films is performed.

Then, the TFT array substrate 200 and the color filter substrate 100 are bonded together with the seal member 106 so that the substrates oppose each other.

After a liquid crystal is injected into the display area, which is the space on the inside of the seal member 106, sealing and other necessary processing are performed to complete the liquid crystal panel.

FIG. 31 is a cross-sectional view illustrating the structure corresponding to the portion taken along line Z-Z' in FIGS. 1 to 3. Note that constituent elements such as the red color material 102, the green color material 103, the blue color material 104, the black matrix 101, the overcoat layer 105, the columnar spacer, the alignment layer on the TFT array substrate 200, and the alignment layer on the color filter substrate 100 are not shown in FIG. 31.

In FIG. 31, the oxide semiconductor film 107*c*, which is the counter electrode in the area B, exhibits the properties of a conductor. The oxide semiconductor film 107*d*, which is the counter electrode in the area A, exhibits the properties of an insulator. Moreover, the silicon oxide film 110*a* is formed under the oxide semiconductor film 107*c* which is the counter electrode in the area B, i.e., formed between the color filter substrate 100 and the oxide semiconductor film 107*c*.

On the color filter substrate 100, the oxide semiconductor film 107*d*, which is the counter electrode in the area A, is an insulator film. Thus, even if the insulating properties of the insulation film 203 on the terminal lines 201 of the TFT array substrate 200 deteriorate due to the insulation film 203 being damaged by a foreign substance and moreover if moisture or the like enters into the clearance of the insulation film 203 formed by the foreign substance in a high humidity environment, no conductive circuit is formed between the terminal lines 201 on the TFT array substrate 200 and the counter electrode on the color filter substrate 100. It is thus possible to prevent the occurrence of defects such as disconnection due to electrolytic corrosion.

Even if a metallic foreign substance (i.e., conductor foreign substance), instead of moisture, enters into the clearance of the insulation film, no continuity is established for the same reason, i.e., because the counter electrode is an insulation film.

Advantageous Effects

Advantageous effects of the above-described embodiments will now be described hereinafter.

According to the above-described embodiments, the display includes the TFT array substrate 200, which is an array substrate, the terminal lines 201, which serve as electrodes, the insulation film 203, the color filter substrate 100, the oxide semiconductor films 107*c* and 107*d*, and the seal member 106.

The terminal lines 201 are formed on the surface of the TFT array substrate 200. The insulation film 203 is formed to cover the terminal lines 201.

The oxide semiconductor films 107*c* and 107*d* are formed on the surface of the color filter substrate 100.

The seal member 106 is located between the insulation film 203 and the oxide semiconductor film, which face each other, and bonds the insulation film 203 and the oxide semiconductor film together.

Here, the area that is sandwiched between the TFT array substrate 200 and the color filter substrate 100 and that is surrounded by the seal member 106 in plan view is taken as the display area.

Of the oxide semiconductor film, the oxide semiconductor film 107*c* that is the portion corresponding to the display area is a conductor, and the oxide semiconductor film 107*d* that is the portion corresponding to the outside of the display area is an insulator.

With this configuration, the insulating properties of the terminal lines 201 on the TFT array substrate 200 can be maintained without adding any steps for avoiding formation of the counter electrode on the peripheral portion of the color filter substrate 100.

More specifically, of the oxide semiconductor film formed on the surface of the color filter substrate 100, the oxide semiconductor film 107*c* that is a portion corresponding to the display area is a conductor, and the oxide semiconductor film 107*d* that is a portion corresponding to the outside of the display area is an insulator. Thus, even if the terminal lines 201 are exposed due to the insulation film 203 being damaged by the foreign substance 1001 on the outside of the display area, the occurrence of a situation can be reduced in which a conductive circuit is formed due to the moisture 1002 or the like between the counter electrode on the color filter substrate 100 and the terminal lines 201 on the TFT array substrate 200. It is thus possible to prevent the occurrence of problems such as disconnection due to electrolytic corrosion.

Besides, since the insulator on the outside of the display area is formed using the characteristics of the oxide semiconductor, there is no need to add any steps for avoiding formation of the counter electrode on the peripheral portion of the color filter substrate 100.

Note that constituent elements described in the specification of the present invention other than those described above may be appropriately omitted. That is, the advantageous effects described above can be implemented by only the constituent elements described above. However, the advantageous effects described above can also be implemented in a similar manner even if at least one of the other constituent elements described in the specification of the present invention is appropriately added to the configuration described above, i.e., even if other constituent elements in the specification of the present invention that are not described as the constituent elements in the above description are added to the constituent elements described above.

According to the above-described embodiments, the display includes the silicon oxide film 110 formed on the surface of the oxide semiconductor film 107*c*, which is the portion of the oxide semiconductor film that corresponds to the display area.

With this configuration, only the oxide semiconductor film 107*c* that is in contact with the silicon oxide film 110 is transformed to a conductor by the application of ultraviolet rays (UV). That is, the oxide semiconductor film 107*c* that is a conductor is formed in the area B of the counter electrode, and the oxide semiconductor film 107*d* that is an insulator is formed in the area A on the outside of the seal member.

According to the above-described embodiments, the display includes the silicon oxide film 110*a* formed on the surface of the portion of the color filter substrate 100 that corresponds to the display area.

The oxide semiconductor film 107*c* covers the silicon oxide film 110*a*. The oxide semiconductor film 107*d* is formed on the surface of the color filter substrate 100.

With this configuration, only the oxide semiconductor film 107*c* that is in contact with the silicon oxide film 110*a* is transformed to a conductor by the application of ultraviolet rays (UV). That is, the oxide semiconductor film 107*c* that is a conductor is formed in the area B of the counter electrode, and the oxide semiconductor film 107*d* that is an insulator is formed in the area A on the outside of the seal member.

According to the above-described embodiments, in the method of manufacturing a display, the terminal lines 201 are formed on the surface of the TFT array substrate 200. Then, the insulation film 203 that covers the terminal lines 201 is formed.

On the other hand, an oxide semiconductor film is formed on the surface of the color filter substrate 100. Then, the insulation film 203 and the oxide semiconductor film, which face each other, are bonded together with the seal member 106.

Here, the area that is sandwiched between the TFT array substrate 200 and the color filter substrate 100 and that is surrounded by the seal member 106 in plan view is taken as the display area.

Of the oxide semiconductor film, the oxide semiconductor film 107c that is a portion corresponding to the display area is conductor, and the oxide semiconductor film 107d that is a portion corresponding to the outer side of the display area is an insulator.

With this configuration, the insulating properties of the terminal lines 201 on the TFT array substrate 200 can be maintained without adding any steps for avoiding formation of the counter electrode on the peripheral portion of the color filter substrate 100.

More specifically, of the oxide semiconductor film formed on the surface of the color filter substrate 100, the oxide semiconductor film 107c that is a portion corresponding to the display area is a conductor, and the oxide semiconductor film 107d that is a portion corresponding to the outside of the display area is an insulator. Thus, even if the terminal lines 201 are exposed due to the insulation film 203 being damaged by the foreign substance 1001 outside the display area, the occurrence of a situation can be reduced in which a conductive circuit is formed due to the moisture 1002 or the like between the counter electrode on the color filter substrate 100 and the terminal lines 201 on the TFT array substrate 200. It is thus possible to prevent the occurrence of problems such as disconnection due to electrolytic corrosion.

Besides, since the insulator on the outside of the display area is formed using the characteristics of the oxide semiconductor, there is no need to add any steps for avoiding formation of the counter electrode on the peripheral portion of the color filter substrate 100.

Note that constituent elements described in the specification of the present invention other than those described above may be appropriately omitted. That is, the advantageous effects described above can be implemented by only the constituent elements described above. However, the advantageous effects described above can also be implemented in a similar manner even if at least one of the other constituent elements described in the specification of the present invention is appropriately added to the configuration described above, i.e., even if other constituent elements in the specification of the present invention that are not described as the constituent elements in the above description are added to the constituent elements described above.

According to the above-described embodiments, in the method for manufacturing a display, plasma treatment using gas that contains hydrogen is performed on the portion of the oxide semiconductor film that corresponds to the display area. Moreover, plasma treatment using gas that contains $N_2O$ is performed on the portion of the oxide semiconductor film that corresponds to the outside of the display area.

With this configuration, the oxide semiconductor film 107c that is a conductor is formed on the portion of the oxide semiconductor film that corresponds to the display area. Moreover, the oxide semiconductor film 107d that is an insulator is formed on the portion of the oxide semiconductor film that corresponds to the outside of the display area.

According to the above-described embodiments, in the method for manufacturing a display, ultraviolet treatment is performed on the portion of the oxide semiconductor film that corresponds to the display area. Moreover, plasma treatment using gas that contains $N_2O$ is performed on the portion of the oxide semiconductor film that corresponds to the outside of the display area.

With this configuration, the oxide semiconductor film 107c that is a conductor is formed on the portion of the oxide semiconductor film that corresponds to the display area. Moreover, the oxide semiconductor film 107d that is an insulator is formed on the portion of the oxide semiconductor film that corresponds to the outside of the display area.

<Variations>

While the above embodiments describe the oxide semiconductor made of InGaZnO as an example of oxide semiconductors, examples of oxide semiconductors are not limited to those described above. The examples also include InZnO-, InGaO-, InSnO-, InSnZnO-, InGaZnSnO-, InAlZnO-, InHfZnO-, InZrZnO-, InMgZnO-, and InYZnO-based oxide semiconductor films, where Hf is hafnium, Zr is zirconium, Mg is magnesium, and Y is yttrium. Even in the case of using any of these oxide semiconductor materials, similar advantageous effects can be achieved as in the case of the above-described embodiments using the InGaZnO-based oxide semiconductor film.

While in the third embodiment, the silicon oxide film is deposited using a metallic mask, the silicon oxide film may be formed such that a resist is formed using a photolithographic system, and a portion of the silicon oxide film that corresponds to the area A is removed by etching using a dry etching system or a wet etching system.

While the first, second, and third embodiments describe an example of the structure of a typical color filter as a color filter substrate, the color filter may have a different structure. As another alternative, the color filter substrate may not include a color filter.

While the first, second, and third embodiments describe an example in which a liquid crystal is injected in a vacuum, other methods such as instillation may be used.

While the first, second, and third embodiments describe a case in which the alignment layer is formed and further subjected to rubbing, the other methods such as photoalignment may be used.

The $N_2O$ plasma treatment in the above-described embodiments may use gas that contains at least $N_2O$. The $H_2$ plasma treatment in the above-described embodiments may use gas that contains at least hydrogen. For example, ammonia ($NH_3$) may be used.

While the above-described embodiments describe a case in which a low-pressure mercury lamp is used in the ultraviolet (UV) treatment, ultraviolet (UV) lamps such as an ultraviolet laser, a high-pressure mercury lamp, or an ultrahigh-pressure mercury lamp may be used. For example, a lamp that emits ultraviolet light having a wavelength of approximately 480 nm or less may be used.

While the plasma treatment described above uses a metallic mask for limited partial treatment, any device that can carry out limited partial treatment may be used.

While in the above-described embodiments, the boundary between the area A and the area B is located at the surface (almost the center of the surface) of the oxide semiconductor film that is in contact with the seal member 106, the boundary between the area A and the area B may be located at the outer edge portion of the display area on the inside of the seal member. Alternatively, the boundary between the area A and the area B may be located at any position of the seal member.

While in the above-described embodiments, IGZO has a thickness of approximately 80 nm, the thickness may be at least greater than or equal to approximately 5 nm. If IGZO has a thickness of less than 5 nm, the resistance value of the overall film will increase, making it difficult for IGZO to properly function as an electrode.

On the other hand, the upper-limit value of the thickness of IGZO is set to less than or equal to approximately 1 µm. If the thickness of IGZO is too large, productivity will drop. Besides, IGZO having a too large thickness will exhibit low transmittance. Thus, the thickness of IGZO is appropriately determined according to the product specification. In general, the thickness of IGZO is preferably greater than or equal to approximately 10 nm and less than or equal to approximately 500 nm.

While in the above-described embodiments, the silicon oxide film has a thickness of approximately 50 nm, the thickness may be at least greater than or equal to approximately 1 nm. If the silicon oxide film has a thickness of approximately less than 1 nm, it becomes difficult to form a uniform film and it becomes not possible to achieve enough advantageous effects of the above-described embodiments.

On the other hand, the upper-limit value of the thickness of the silicon oxide film is set to less than or equal to approximately 1 µm. If the thickness of the silicon oxide film is too large, productivity will drop. Besides, the silicon oxide film having a too large thickness will increase a difference in level of the silicon oxide film formed under the IGZO film in the fourth embodiment, thus deteriorating the coverage of the IGZO film. When the silicon oxide film is formed on the upper side of the IGZO film as in the third embodiment, the silicon oxide film having a too large thickness will cause a reduction in the electric field applied to the liquid crystal, thus degrading display quality. Accordingly, the thickness of the silicon oxide film is, in general, preferably set to less than or equal to approximately 500 nm.

In the third, fourth, and fifth embodiments, ultraviolet rays (UV) are applied from the side of the color filter substrate opposite to the side where the glass surface is located. However, ultraviolet rays (UV) may be applied from the side of the color filter substrate where the glass surface is located. Even in this case, the effect that the oxide semiconductor film transforms from either semiconductor or insulator to conductor remains unchanged.

While the above embodiments also describe features such as materials, properties of the materials, dimensions, shapes, and relative locations and positioning of constituent elements or conditions for implementation, these features are all illustrative in all aspects and are not limited to those described in the specification of the present invention. Thus, numeral variations that are not described and illustrated are assumed to fall within the scope of the technique of the present invention. Examples include cases where at least one constituent element is modified, added, or omitted and where at least one constituent element in at least one embodiment is extracted and combined with constituent elements of another embodiment.

In the above-described embodiments, "one" constituent element may include "one or more" constituent elements as long as no contradiction arises. Moreover, each constituent element may be perceived as a conceptual unit, and the present invention may include cases where one constituent element includes a plurality of structural elements, where one constituent element corresponds to part of a structural element, and where a plurality of constituent elements are included in one structural element. Each constituent element may include structural elements having other structures or shapes as long as its function remains unchanged.

The description in the specification of the present invention shall be referred to for all purposes relating to the technique of the present invention, and nothing in the specification shall be regarded as conventional technology.

When features such as the names of materials are described with no particular specification in the above-described embodiments, those materials may include other additives such as an alloy, as long as no contradiction arises.

EXPLANATION OF REFERENCE SIGNS

100: Color filter substrate, 101: Black matrix, 102: Red color material, 103: Green color material, 104: Blue color material, 105: Overcoat layer, 106: Seal member, 107, 107a: Counter electrode, 107b, 107c, 107d: Oxide semiconductor film, 108: Protective film, 109, 109a: Metallic mask, 110, 110a: Silicon oxide film, 200: TFT array substrate, 201: Terminal line, 202: External connection terminal, 203: Insulation film, 1000: Liquid crystal, 1001: Foreign substance, 1002: Moisture, A, B: Area

The invention claimed is:

1. A display comprising:
a first substrate;
an electrode formed on a surface of said first substrate;
an insulation film formed to cover said electrode;
a second substrate;
an oxide semiconductor film formed on a surface of said second substrate; and
a seal member that is located between said insulation film and said oxide semiconductor film facing each other and that bonds said insulation film and said oxide semiconductor film together,
wherein an area that is sandwiched between said first substrate and said second substrate and surrounded by said seal member in plan view is taken as a display area, and
a portion of said oxide semiconductor film that corresponds to said display area is a conductor, and a portion of said oxide semiconductor film that corresponds to an outside of said display area is an insulator.

2. The display according to claim 1, further comprising:
a silicon oxide film formed on a surface of the portion of said oxide semiconductor film that corresponds to said display area.

3. The display according to claim 1, further comprising:
a silicon oxide film formed on a surface of a portion of said second substrate that corresponds to said display area,
wherein said oxide semiconductor film covers said silicon oxide film and is formed on the surface of said second substrate.

4. The display according to claim 1, wherein
a boundary between the portion of said oxide semiconductor film that is a conductor and the portion of said oxide semiconductor film that is an insulator is located at a surface of said oxide semiconductor film that is in contact with said seal member.

5. The display according to claim 4, wherein
said boundary between the portion of said oxide semiconductor film that is a conductor and the portion of said oxide semiconductor film that is an insulator is located at an end portion on said display area side out of the surface of said oxide semiconductor film that is in contact with said seal member.

6. The display according to claim 1, wherein
said oxide semiconductor film is one of InGaZnO-, InZnO-, InGaO-, InSnO-, InSnZnO-, InGaZnSnO-, InAlZnO-, InHfZnO-, InZrZnO-, InMgZnO-, and InYZnO-based oxide semiconductor films, where Hf is hafnium, Zr is zirconium, Mg is magnesium, and Y is yttrium.

7. A method for manufacturing a display, comprising:
forming an electrode on a surface of a first substrate;
forming an insulation film that covers said electrode;
forming an oxide semiconductor film on a surface of a second substrate; and
bonding said insulation film and said oxide semiconductor film with a seal member, said insulation film and said oxide semiconductor film facing each other,
wherein an area that is sandwiched between said first substrate and said second substrate and surrounded by said seal member in plan view is taken as a display area, and
a portion of said oxide semiconductor film that corresponds to said display area is a conductor, and a portion of said oxide semiconductor film that corresponds to an outside of said display area is an insulator.

8. The method for manufacturing a display according to claim 7, wherein
plasma treatment using gas that contains hydrogen is performed on the portion of said oxide semiconductor film that corresponds to said display area, and
plasma treatment using gas that contains $N_2O$ is performed on the portion of said oxide semiconductor film that corresponds to the outside of said display area.

9. The method for manufacturing a display according to claim 7, further comprising:
forming a silicon oxide film on a surface of the portion of said oxide semiconductor film that corresponds to said display area.

10. The method for manufacturing a display according to claim 7, further comprising:
forming a silicon oxide film on a surface of a portion of said second substrate that corresponds to said display area, and
forming an oxide semiconductor film on a surface of said silicon oxide film and on a surface of said second substrate.

11. The method for manufacturing a display according to claim 9, further comprising:
performing ultraviolet treatment on the portion of said oxide semiconductor film that corresponds to said display area; and
performing plasma treatment using gas that contains $N_2O$ on the portion of said oxide semiconductor film that corresponds to the outside of said display area.

12. The method for manufacturing a display according to claim 11, wherein
said ultraviolet treatment, which is performed on the portion of said oxide semiconductor film that corresponds to said display area, includes applying ultraviolet light having a wavelength of less than or equal to 480 nm.

13. The method for manufacturing a display according to claim 7, wherein
said oxide semiconductor film is one of InGaZnO-, InZnO-, InGaO-, InSnO-, InSnZnO-, InGaZnSnO-, InAlZnO-, InHfZnO-, InZrZnO-, InMgZnO-, and InYZnO-based oxide semiconductor films, where Hf is hafnium, Zr is zirconium, Mg is magnesium, and Y is yttrium.

* * * * *